United States Patent
Hill

(10) Patent No.: US 7,327,465 B2
(45) Date of Patent: Feb. 5, 2008

(54) COMPENSATION FOR EFFECTS OF BEAM MISALIGNMENTS IN INTERFEROMETER METROLOGY SYSTEMS

(75) Inventor: Henry A. Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 238 days.

(21) Appl. No.: 11/250,116

(22) Filed: Oct. 13, 2005

(65) Prior Publication Data

US 2006/0061771 A1    Mar. 23, 2006

Related U.S. Application Data

(63) Continuation-in-part of application No. 10/872,304, filed on Jun. 18, 2004.

(60) Provisional application No. 60/479,741, filed on Jun. 19, 2003.

(51) Int. Cl.
*G01B 11/02* (2006.01)
(52) U.S. Cl. .................. 356/498; 356/510
(58) Field of Classification Search ............ 356/486, 356/487, 498, 500, 508, 510, 493
See application file for complete search history.

(56) References Cited

U.S. PATENT DOCUMENTS

| | | | |
|---|---|---|---|
| 4,355,900 A | * | 10/1982 | Nussmeier ............ 356/498 |
| 4,606,638 A | | 8/1986 | Sommargren |
| 4,662,750 A | | 5/1987 | Barger |
| 4,688,940 A | | 8/1987 | Sommargren et al. |
| 4,711,573 A | | 12/1987 | Wijntjes et al. |
| 4,714,339 A | | 12/1987 | Lau et al. |
| 4,790,651 A | | 12/1988 | Brown et al. |
| 4,802,765 A | | 2/1989 | Young et al. |
| 4,859,066 A | | 8/1989 | Sommargren |

(Continued)

FOREIGN PATENT DOCUMENTS

EP     0 895 279    2/1999

(Continued)

OTHER PUBLICATIONS

Badami, V.G. et al. "Investigation of Nonlinearity in High Accuracy Heterodyne Laser Interferometry." American Society for Precision Engineering 1997 Proceedings, 16:pp. 153-166, 1997.

(Continued)

*Primary Examiner*—Patrick Connolly
(74) *Attorney, Agent, or Firm*—Fish & Richardson P.C.

(57) ABSTRACT

In general, in a first aspect, the invention features methods that include deriving a first beam and a second beam from an input beam and directing the first and second beams along different paths, where the path of the first beam contacts a measurement object, producing an output beam comprising a phase related to an optical path difference between the different beam paths, determining a position of the measurement object with respect to at least one degree of freedom based on information derived from the output beam, monitoring variations in a direction of the input beam, and using the monitored variations in the direction of the input beam to reduce errors in the determined position associated with deviations of the path of the input beam from a nominal input beam path.

39 Claims, 15 Drawing Sheets

U.S. PATENT DOCUMENTS

| | | | |
|---|---|---|---|
| 4,881,816 A | 11/1989 | Zanoni | |
| 4,948,254 A | 8/1990 | Ishida | |
| 5,064,289 A | 11/1991 | Bockman | |
| 5,114,234 A | 5/1992 | Otsuka et al. | |
| 5,151,749 A | 9/1992 | Tanimoto et al. | |
| 5,187,543 A | 2/1993 | Ebert | |
| 5,331,400 A | 7/1994 | Wilkening et al. | |
| 5,363,196 A | 11/1994 | Cameron | |
| 5,404,222 A | 4/1995 | Lis | |
| 5,408,318 A | 4/1995 | Slater | |
| 5,483,343 A | 1/1996 | Iwamoto et al. | |
| 5,491,550 A | 2/1996 | Dabbs | |
| 5,537,209 A | 7/1996 | Lis | |
| 5,657,122 A * | 8/1997 | Curbelo et al. | 356/452 |
| 5,663,793 A | 9/1997 | de Groot | |
| 5,663,893 A | 9/1997 | Wampler et al. | |
| 5,715,057 A | 2/1998 | Bechstein et al. | |
| 5,724,136 A | 3/1998 | Zanoni | |
| 5,739,907 A * | 4/1998 | Chen | 356/498 |
| 5,757,160 A | 5/1998 | Kreuzer | |
| 5,757,489 A | 5/1998 | Kawakami | |
| 5,764,361 A * | 6/1998 | Kato et al. | 356/493 |
| 5,764,362 A | 6/1998 | Hill et al. | |
| 5,781,277 A | 7/1998 | Iwamoto | |
| 5,790,253 A | 8/1998 | Kamiya | |
| 5,801,832 A | 9/1998 | Van Den Brink | |
| 5,838,485 A | 11/1998 | de Groot et al. | |
| 5,877,843 A | 3/1999 | Takagi et al. | |
| 6,008,902 A | 12/1999 | Rinn | |
| 6,020,964 A | 2/2000 | Loopstra et al. | |
| 6,040,096 A | 3/2000 | Kakizaki | |
| 6,046,792 A | 4/2000 | Van Der Werf et al. | |
| 6,124,931 A | 9/2000 | Hill | |
| 6,134,007 A | 10/2000 | Naraki et al. | |
| 6,137,574 A | 10/2000 | Hill | |
| 6,157,660 A | 12/2000 | Hill | |
| 6,159,644 A | 12/2000 | Satoh et al. | |
| 6,160,619 A | 12/2000 | Magome | |
| 6,181,420 B1 | 1/2001 | Badami et al. | |
| 6,201,609 B1 | 3/2001 | Hill et al. | |
| 6,208,424 B1 | 3/2001 | de Groot | |
| 6,219,144 B1 | 4/2001 | Hill | |
| 6,236,507 B1 | 5/2001 | Hill et al. | |
| 6,246,481 B1 | 6/2001 | Hill | |
| 6,252,667 B1 * | 6/2001 | Hill et al. | 356/487 |
| 6,252,668 B1 | 6/2001 | Hill | |
| 6,271,922 B1 | 8/2001 | Bulow et al. | |
| 6,271,923 B1 * | 8/2001 | Hill | 356/487 |
| 6,304,318 B1 | 10/2001 | Matsumoto | |
| 6,313,918 B1 | 11/2001 | Hill et al. | |
| 6,327,039 B1 | 12/2001 | de Groot et al. | |
| 6,330,065 B1 | 12/2001 | Hill | |
| 6,330,105 B1 | 12/2001 | Rozelle et al. | |
| 6,384,899 B1 | 5/2002 | den Boef | |
| 6,417,927 B2 | 7/2002 | de Groot | |
| 6,541,759 B1 * | 4/2003 | Hill | 250/227.27 |
| 6,631,004 B1 * | 10/2003 | Hill et al. | 356/487 |
| 6,738,143 B2 | 5/2004 | Chu | |
| 6,839,141 B2 | 1/2005 | Hill | |
| 6,856,402 B2 * | 2/2005 | Hill | 356/487 |
| 6,888,638 B1 * | 5/2005 | Hill | 356/498 |
| 6,917,432 B2 * | 7/2005 | Hill et al. | 356/520 |
| 6,947,148 B2 * | 9/2005 | Hill | 356/493 |
| 6,987,569 B2 * | 1/2006 | Hill | 356/500 |
| 7,139,080 B2 * | 11/2006 | Hill et al. | 356/498 |
| 7,196,798 B2 * | 3/2007 | Tsai | 356/500 |
| 2001/0035959 A1 | 11/2001 | Hill | |
| 2002/0001086 A1 | 1/2002 | De Groot | |
| 2002/0048026 A1 | 4/2002 | Isshiki et al. | |
| 2002/0089671 A1 | 7/2002 | Hill | |
| 2003/0043384 A1 * | 3/2003 | Hill | 356/510 |
| 2003/0090675 A1 | 5/2003 | Fujiwara | |
| 2004/0114152 A1 * | 6/2004 | Hill et al. | 356/498 |

FOREIGN PATENT DOCUMENTS

| | | |
|---|---|---|
| GB | 2070276 | 9/1981 |
| JP | 9-178415 | 7/1997 |
| JP | 9-280822 | 10/1997 |
| JP | 10-260009 | 9/1998 |
| WO | WO 00/17605 | 3/2000 |
| WO | WO 01/90686 | 11/2001 |

OTHER PUBLICATIONS

Bennett, S.J. "A Double-Passed Michelson Interferometer." Optics Communications, 4:6, pp. 428-430, 1972.

Bobroff, Norman. "Recent advances in displacement measuring interferometry." Meas. Sci. Technol, 4: pp. 907-926, 1993.

Hines, Brad et al. "Sub-Nanometer Laser Metrology—Some Techniques and Models." European Southern Observatory, ESO Conference, pp. 1195-1204, 1991.

Oka, K. et al. "Polarization heterodyne interferometry using another local oscillator beam." Optics Communications, 92:pp. 1-5, 1992.

Wu, Chien-Ming. Analytical modeling of the periodic nonlinearity in heterodyne interferometry. Applied Optics, 37:28 pp. 6696-6700, 1998.

Mauer, Paul. "Phase Compensation of Total Internal Reflection." J. Opt. Soc. Am., 56:9, pp. 1219-1221, 1966.

Player, M.A. "Polarization properties of a cube-corner reflector." J. Mod. Opt., 35:11, pp. 1813-1820, 1988.

Bobroff, Norman. "Residual errors in laser interferometry from air turbulence and nonlinearity." Applied Optics, 26:13, pp. 2676-2686, 1987.

Jones, F.E. "The Refractivity of Air," J. Res. NBS 86:1, pp. 27-32, 1981.

Estler, W.T. "High-Accuracy Displacement Interferometry in Air," Appl. Opt. 24:6, pp. 808-815, 1985.

Zhu et al., "Long-Arm Two-Color Interferometer for Measuring the Change of Air Refractive Index," SPIE 1319, pp. 538-539, 1990.

Ishida, A. "Two Wavelength Displacement-Measuring Interferometer using Second-Harmonic Light to Eliminate Air-Turbulence-Induced Errors," Jpn. J. Appl. Phys. 28:3, pp. L473-475, 1989.

Lis, S.A. "An Air Turbulence Compensated Interferometer for IC Manufacturing," SPIE 2440, 1995.

* cited by examiner

COMPENSATION FOR EFFECTS OF BEAM MISALIGNMENTS IN INTERFEROMETER METROLOGY SYSTEMS

CROSS-REFERENCE TO RELATED APPLICATIONS

This application is a continuation-in-part of and claims priority under 35 U.S.C. § 120 to U.S. patent application Ser. No. 10/872,304, entitled "COMPENSATION FOR GEOMETRIC EFFECTS OF BEAM MISALIGNMENTS IN PLANE MIRROR INTERFEROMETER METROLOGY SYSTEMS," filed on Jun. 18, 2004, which claims priority to Provisional Patent Application 60/479,741, entitled "COMPENSATION FOR GEOMETRIC EFFECTS OF BEAM MISALIGNMENTS IN PLANE MIRROR INTERFEROMETER METROLOGY SYSTEMS," filed on Jun. 19, 2003, the entire contents of both of which are hereby incorporated by reference.

BACKGROUND

This invention relates to interferometers, e.g., linear and angular displacement measuring and dispersion interferometers, that measure linear and angular displacements of a measurement object such as a mask stage or a wafer stage in a lithography scanner or stepper system, and also interferometers that monitor wavelength and determine intrinsic properties of gases.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$, ideally, is directly proportional to L, and can be expressed as $$\Phi = 2pkL \cos^2 \theta \qquad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, Equation (1) can be approximated by $$\Phi = 2pkL(1-\theta^2) \qquad (2)$$

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2pnL. A first order cyclic error in phase has, for example, a sinusoidal dependence on $(4\pi pnL)/\lambda$ and a second order cyclic error in phase has, for example, a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics.

There are in addition to the cyclic errors, non-cyclic non-linearities or non-cyclic errors. An example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shearing can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

Accordingly, due to errors such as the aforementioned cyclic and non-cyclic errors, the observable interference phase typically includes contributions in addition to $\Phi$. Thus, the observable phase is more accurately expressed as $$\tilde{\Phi} = \Phi + \psi + \zeta \quad (3)$$

where $\psi$ and $\zeta$ are the contributions due to the cyclic and non-cyclic errors, respectively.

The effect of contributions to the observable phase due to cyclic and non-cyclic errors can be reduced by quantifying these errors in each interferometer and correcting subsequent measurements with this data. Different techniques for quantifying cyclic errors are described in commonly owned U.S. Pat. No. 6,252,668, U.S. Pat. No. 6,246,481, U.S. Pat. No. 6,137,574, and U.S. patent application Ser. No. 10/287,898 entitled "INTERFEROMETRIC CYCLIC ERROR COMPENSATION" filed Nov. 5, 2002 by Henry A. Hill, the entire contents each of which are incorporated herein by reference. In order to compensate for these contributions, cyclic error compensating systems and methods can be used to determine a cyclic error function characterizing the cyclic error contribution to the observed phase. Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill, filed on Feb. 12, 2003, the entire contents of which are incorporated herein by reference.

Assuming any contributions due to cyclic and/or non-cyclic errors are small or otherwise compensated, according to Equation (2) the observable phase measured by a displacement measuring interferometer should be equal to $2pkL(1-\theta^2)$. This relationship assumes that the optical path difference between the measurement and reference beam is equal to $2pkL(1-\theta^2)$ and allows one to readily determine a change in L, corresponding to a change in displacement of the measurement object from the interferometer, from the measured phase, provided the orientation of the measurement object is known.

In the case of an interferometric metrology system including two or more linear displacement plane mirror interferometers used, in part, to measure a change in angular orientation of a measurement object, the observable phases measured by the two or more interferometers should each be of the form $2pkL(1-\theta^2)$. The resulting differences of phases obtained either optically or electronically can be used to compute a change in angular orientation of a measurement object common to the two or more plane mirror interferometers, provided that the measurement axes of the two or more interferometers are parallel.

SUMMARY

In certain aspects, the invention is based on the realization that a deviation of one or more of the interferometer beams from a nominal beam path can cause the optical path difference to vary from the optical path difference assumed for Equation (2). Errors arising from such deviations are referred to as geometric non-cyclic errors. Where such errors arise, using the relationship in Equation (2) to determine a change in L from the measured phase can provide erroneous results, which can be detrimental in applications demanding a high level of precision. Furthermore, effects of such beam path deviations are heightened where changes in L are comparatively large (e.g., 0.5 m or more) because the contribution of a beam path deviation to the optical path difference typically scales with L.

In some aspects, the invention is based on the realization that in multiple pass interferometers (e.g., double pass interferometers), a compensation scheme that accounts for geometric errors associated with imperfections in the measurement object should account for imperfections at each location of the measurement object that is contacted by an interferometer beam. For example, in system's using a double pass interferometer and a plane mirror measurement object, compensation for mirror imperfections should account for imperfections at both mirror locations that are contacted by the interferometer measurement beam.

Compensation scheme's accounting for each point of contact of an interferometer beam on the measurement object can account for imperfections of the measurement object which vary between the points of contact. In a double pass interferometer, for example, such a compensation scheme can account for measurement object imperfections that cancel out each other's contribution to the measured phase. In contrast, a compensation scheme which accounts only for mirror imperfections at one location (e.g., along the interferometer axis), for example, can provide erroneous compensation by failing to accommodate for variations between the imperfections at each contact location of an interferometer beam on the measurement object.

Imperfections in a measurement object can introduce a displacement of the measurement object from a nominal measurement object position. Alternatively, or additionally, imperfections in a measurement object can deflect an incident beam from a nominal beam path, which is the path the beam would follow in the absence of any imperfections in the measurement object. In some aspects, the invention is based on the realization that to accurately compensate for imperfections in the measurement object, a compensation scheme should account for beam deflections both within and out of the plane of incidence (i.e., the plane defined by the nominal beam path and the measurement object surface normal).

Accordingly, in certain aspects, the invention features methods and systems that accurately compensate an interferometer measurement for geometric errors due to mirror imperfections.

Alternatively, or additionally, embodiments can include compensating interferometer measurements for imperfections in one or more optics of the interferometer and/or for imperfections in the light source used by the interferometer. For example, interferometry systems and methods can include monitoring and compensating variations in a direction of the system's input beam from a nominal input beam path. In certain embodiments, a beam direction monitoring apparatus is used to monitor variations in the direction of the input beam and provide information about the input beam direction to the interferometry system, which uses the information to correct or otherwise account for deviations of the input beam from the nominal input beam path. An example of a beam direction monitoring apparatus is an angle measuring interferometer. In some embodiments, the interferometry system accounts for variations in the input beam direction by using the information from an angle detection system to calculate or look up a correction factor used when making measurements using the interferometry system. Alternatively, or additionally, the interferometry system can include a dynamic component that adjusts the direction of the input beam during operation of the interferometry system to reduce deviations of the input beam from the nominal input beam path.

In some aspects, the invention is based on the realization that in a multiple degree of freedom interferometry system, a deviation of one or more of the interferometer measurement axes from nominally parallel measurement axes can cause errors in computed changes in a degree of freedom of a common measurement object. For example, where an interferometry system monitors an angular orientation of a stage mirror by monitoring the displacement of the stage mirror along two nominally parallel axes, misalignment of the axes introduces an error into the measured angular orientation. Moreover, because the separation of the interferometer axes varies as a function of the mirror's displacement along the axes, the error will vary systematically with the displacement of the stage mirror along the axes. Where such errors arise, using the relationship in Equation (2) to determine respective values of L from the measured phase can provide erroneous results, which can be detrimental in applications demanding a high level of precision.

Accordingly, in certain aspects, the invention features methods and systems for compensating interferometer measurements to account for misalignment of interferometer axes in a multiple degree of freedom interferometer system. Moreover, in some aspects, the invention features methods and systems for compensating interferometer measurements to account for deviations of beam paths from the nominal beam path of a single interferometer or from the nominal beam paths of a multiple degree of freedom interferometer system. Deviations of interferometer beams paths from the nominal path can be determined while calibrating the interferometer or interferometer system prior to its use and/or during periods where the interferometry system is off-line. This precalibrated information is provided with the interferometer or interferometry system, and used by the system to correct measurements so that they account for the beam path deviations.

Sources of beam path deviations include imperfections in one or more of the optical components making up the interferometer or interferometer system, imperfections in the measurement object, and instabilities in the interferometer light source that may cause the path of the interferometer or interferometer system input beam to vary, and misalignments of input beams to respective interferometers of a multiple degree of freedom interferometer system. Beam path deviations can be characterized with respect to a nominal path corresponding to a perfectly aligned, defect free system. The nominal path for the measurement beam and measurement beam component of the output beam depends on the angular orientation of the measurement object. In other words, the nominal path is the path for which the optical path difference corresponds identically to $2pkL(1-\theta^2)$, where L and $\theta$ are measured with respect to a fixed reference co-ordinate system. Also the nominal path for the reference beam and reference beam component of the output beam depends on the angular orientation of the reference object that may also be variable.

The precalibrated information may be stored as a representation (e.g., a lookup table or a functional representation) in an electronic data storage medium (e.g., a memory chip or a disk), which is provided to the interferometer's end user. A control algorithm that runs the interferometer in its end use application accesses the information from the data storage medium, and compensates the interferometer measurement accordingly.

Compensation may be performed on-line in real time or off-line. Application of the methods may be used to isolate effects of other errors, such as non-cyclic errors due to wavefront errors and beam shear.

Interferometers using techniques disclosed herein may be used in lithography tools and beam writing systems.

Various aspects and features of the invention are summarized below.

In general, in a first aspect, the invention features methods that include deriving a first beam and a second beam from an input beam and directing the first and second beams along different paths, where the path of the first beam contacts a measurement object, producing an output beam comprising a phase related to an optical path difference between the different beam paths, determining a position of the measurement object with respect to at least one degree of freedom based on information derived from the output beam, monitoring variations in a direction of the input beam, and using the monitored variations in the direction of the input beam to reduce errors in the determined position associated with deviations of the path of the input beam from a nominal input beam path.

Embodiments of the methods may include one or more of the following features and/or features of other aspects. For example, the variations in the input beam direction may be monitored using an angle interferometer. Variations in the input beam direction may be monitored in a first plane. Variations in the input beam direction may also be monitored in a second plane orthogonal to the first plane. The errors in the determined position of the measurement object may be reduced based on precalibrated information that accounts for contributions to the optical path difference caused by a deviation of the path of the input beam from the nominal input beam path. The precalibrated information may include a set of correction data values and reducing the errors includes selecting one of the values from the set of correction data values based on the monitored variation. The precalibrated information may include a lookup table including the set of correction data values. Reducing the errors may include determining a correction value using the precalibrated information and the monitored variation. The precalibrated information may include information describing a functional relationship between the input beam path and corrections to the position of the measurement object.

In some embodiments, the input beam is directed to the interferometer via a beam steering assembly. The errors may be reduced by adjusting the beam steering assembly to reduce a deviation of the path of the input beam from the nominal input beam path based on the monitored variations. The beam steering assembly may be adjusted using a servo controller that receives information about the monitored variations in the input beam direction. The measurement object may include a plane mirror. The beam steering assembly can cause the measurement beam to be orthogonal to the plane mirror for a range of orientations of the plane mirror.

The method can further include directing a preconditioned input beam to reflect from the measurement object and deriving the input beam from the preconditioned input beam after it reflects from the measurement object. The variations in the input beam direction may be monitored by monitoring variations in the direction of the preconditioned input beam.

In general, in another aspect, the invention features systems that include an interferometer configured to derive a first beam and a second beam from an input beam, to direct the first and second beams along different paths, where the path of the first beam contacts a measurement object, and to produce an output beam comprising a phase related to an optical path difference between the different beam paths. The systems also include an angle interferometer configured to monitor variations in a direction of the input beam and an electronic controller configured to determine a position of the measurement object with respect to at least one degree of freedom based on information derived from the output beam and to use the monitored variations in the direction of the input beam to reduce errors in the determined position associated with deviations of the path of the input beam from a nominal input beam path.

Embodiments of the systems can include one or more of the following features and/or features of other aspects. For example, the interferometer may be a multiple pass interferometer. The angle interferometer can include a beam shearing assembly configured to introduce a shear between two orthogonally polarized components of a secondary beam related to the input beam, the amount of the shear being related to a direction of the secondary beam. The system can further include a beam steering assembly having a beam steering element configured to direct the input beam to the interferometer and an electronic positioning system to selectively orient the beam steering element relative to the interferometer. The system can include a control circuit coupled to the electronic positioning system and configured to cause the electronic positioning system to reorient the beam steering element based on information derived from the output beam or based on the monitored variations in the direction of the input beam.

In some embodiments, the systems include a beam conditioning assembly configured to direct an initial beam to reflect from the measurement object and derive the input beam from the initial beam after it reflects from the measurement object. The beam conditioning assembly can include an optical system configured to direct the initial beam to reflect from the measurement object to cause a change in propagating direction of the input beam in response to a change in the angular orientation of the measurement object with respect to the initial beam. The optical system can include a single pass interferometer. The beam conditioning assembly can further include an afocal system that scales the change in propagation direction of the conditioned beam by an amount related to a magnification of the afocal system. The factor can be about 2 or more (e.g., 2, about 3 or more, about 4 or more).

The system can include a beam splitter configured to derive a secondary beam from the initial beam and to direct the secondary beam to the angle interferometer, and wherein the angle interferometer is configured to monitor variations in the direction of the input beam by monitoring a direction of the secondary beam.

In general, in another aspect, the invention features a method, that includes using an interferometer in an interferometry system to produce an output beam comprising a phase related to an optical path difference between a path of a first beam and a path of a second beam, wherein the first beam contacts a measurement object at a first location and the first or second beam contacts the measurement object at a second location, and wherein the first and second locations are different, providing precalibrated information that accounts for contributions to the optical path difference caused by a deviation of the path of the first or second beam from a nominal beam path due to an imperfection of the measurement object at the first location and due to an imperfection of the measurement object at the second location, and determining a position of the measurement object with respect to at least one degree of freedom based on information derived from the output beam and the precalibrated information.

Embodiments of the method may include one or more of the following features.

The precalibrated information can account for contributions to the optical path difference caused by a deviation of the path of the first or second beam within a plane defined by the nominal beam path due to the imperfection of the measurement object at the first or second location. The precalibrated information can account for contributions to the optical path difference caused by a deviation of the path of the first or second beam out of a plane defined by a nominal beam path due to the imperfection of the measurement object at the first or second location. The precalibrated information can further account for contributions to the optical path difference caused by a deviation of the path of the first or second beam from the nominal beam path due to an imperfection in at least one optic of the interferometer. For example, the imperfection in at least one optic of the interferometer can include an imperfection in a surface of the optic and/or a bulk imperfection in the optic. The precalibrated information can further account for contributions to the optical path difference caused by a deviation of the path of the first or second beam from the nominal beam path due to an imperfection in a light source that causes an input beam derived from the light source to deviate from an input beam path to the interferometer.

The first or second beam can contact the measurement object at one or more additional locations different from the first and second locations and the precalibrated information can account for contributions to the optical path difference caused by a deviation of the path of the first or second beam from the nominal beam path due to an imperfection of the measurement object at one or more additional locations.

The precalibrated information can be parameterized in terms of at least one of an angular orientation of the measurement object relative to the interferometer, a distance between the measurement object and the interferometer, and a direction of an input beam to the interferometer. In some embodiments, the precalibrated information is parameterized in terms of at least two of an angular orientation of the measurement object relative to the interferometer, a distance between the measurement object and the interferometer, and a direction of an input beam to the interferometer. For example, the precalibrated information can be parameterized in terms of an angular orientation of the measurement object relative to the interferometer, a distance between the measurement object and the interferometer, and a direction of an input beam to the interferometer. The precalibrated information can be stored as a representation in an electronic storage medium. For example, the representation can include a lookup table and/or a functional representation.

The determined position of the measurement object with respect to at least one degree of freedom can be related to a displacement of the measurement object relative to the interferometer. For example, the determined position of the measurement object with respect to at least one degree of freedom can be the displacement of the measurement object relative to the interferometer. The determined position of the measurement object with respect to at least one degree of freedom can be related to an angular orientation of the measurement object. For example, the determined position of the measurement object with respect to at least one degree of freedom can be the angular orientation of the measurement object.

Determining the position of the measurement object can include measuring the phase of the output beam and relating the phase to the position of the measurement object based on one or more values derived from the predetermined information. The values derived from the predetermined information can be selected based on the phase. The values derived from the predetermined information can be selected based on an angular orientation of the measurement object.

The values derived from the predetermined information can be selected based on a path of an input beam derived from the light source to the interferometer relative to the nominal path. The method can further include monitoring deviations of the input beam path from the nominal path. A relationship between the phase, $\Phi$, and the optical path difference can be expressed by the equation $$\Phi=2pkL\zeta(1-(\theta_1-\eta_1)^2-(\theta_2-\eta_2)^2)+2k(X_1+X_2),$$

wherein p is an integer, k is a wavenumber, L is a relative distance between the interferometer and the measurement object, $\theta_1$ and $\theta_2$ are angular orientation of the measurement object with respect to the interferometer along orthogonal coordinates, and $\zeta$ and $\eta_1$ and $\eta_2$ are terms that depend on the deviation of at least one of the beam paths from the nominal beam path, and $X_1$ and $X_2$ is are local displacements of a surface of the measurement object from a nominal plane surface at the first and second locations, respectively.

Using the interferometer to produce the output beam can include producing the output beam as the measurement object is moved relative to the interferometer, and determining the position of the measurement object can include monitoring the position of the measurement object during the relative movement. Using the interferometer to produce the output beam can include separating an input beam into at least the first and second beams, directing the first and second beams along their respective paths, and recombining the two beams after one or both of the beams contacts the measurement object. The second beam can contact the measurement object at the second location and the optical path difference can be related to an angular orientation of the measurement object with respect to the interferometer.

In general, in another aspect, the invention features a method, that includes using an interferometer to produce an output beam comprising a phase related to an optical path difference between a path of a first beam and a path of a second beam, wherein the first beam contacts a measurement object at a first location, providing precalibrated information that accounts for contributions to the optical path difference caused by a deviation of the path of the first beam out of a plane defined by a nominal beam path due to an imperfection of the measurement object at the first location, and determining a position of the measurement object with respect to at least one degree of freedom based on information derived from the output beam and the precalibrated information.

Embodiments of the method may include one or more of the following features and/or features of other aspects.

The precalibrated information can account for contributions to the optical path difference caused by a deviation of a path of the first beam out within the plane defined by the nominal beam path due to the imperfection of the measurement object at the first location. The precalibrated information can account for contributions to the optical path difference caused by a local displacement of a surface of the measurement object from a nominal plane surface at the first location. The first or second beam can contact the measurement object at a second location, wherein the first and second locations are different. The precalibrated information can account for contributions to the optical path difference caused by a deviation of the path of the first or second beam from a nominal beam path due to an imperfection of the measurement object at the second location.

In general, in a further aspect, the invention features a method, that includes using an interferometer to produce an output beam comprising a phase related to an optical path difference between a first beam path and a second beam path, wherein the first or second beam contacts a measurement object, providing precalibrated information that accounts for contributions to the optical path difference caused by a deviation of a path of the first beam from a nominal beam path due to an imperfection of the measurement object, and accounts for contributions to the optical path difference caused by a deviation of the path of the first beam from the nominal beam path due to an imperfection in one or more optics of the interferometer or in a light source used to produce the output beam, and determining a position of the measurement object with respect to at least one degree of freedom based on information derived from the output beam and the precalibrated information.

Embodiments of the method may include one or more of the following features and/or features of other aspects.

In general, in another aspect, the invention features a method, that includes using a first interferometer and a second interferometer in an interferometry system to produce a first output beam and a second output beam, respectively, wherein each output beam comprises a phase related to an optical path difference between two beam paths, at least one of which contacts a measurement object, providing precalibrated information that accounts for a misalignment of an axis of the first interferometer relative to an axis of the second interferometer, and determining a position of the measurement object with respect to at least one degree of freedom based on information derived from the first and second output beams and the precalibrated information.

Embodiments of the method may include one or more of the following features and/or features of other aspects.

The degree of freedom can correspond to an angular orientation of the measurement object. For each interferometer, the precalibrated information can account for contributions to the optical path difference caused by a deviation of at least one of the beam paths from a nominal beam path due to other imperfections in the interferometry system. Other imperfections can include an imperfection in at least one optic of the interferometer, an imperfection in the measurement object, or an imperfection in a light source that causes an input beam derived from the light source to deviate from an input beam path for the interferometer.

In general, in another aspect, the invention features an apparatus including an interferometer configured to produce an output beam comprising a phase related to an optical path difference between a path of a first beam and a path of a second beam, wherein the first beam contacts a measurement object at a first location and the first or second beam contacts the interferometer at a second location, and wherein the first and second locations are different, and an electronic controller coupled to the interferometer, wherein during operation the electronic controller determines a position of the measurement object with respect to at least one degree of freedom based on information derived from the output beam and precalibrated information that accounts for contributions to the optical path difference caused by a deviation of at least one of the beam paths from a nominal beam path due to an imperfection of the measurement object at the first location and due to an imperfection of the measurement object at the second location.

Embodiments of the apparatus may include one or more of the features of other aspects.

In general, in another aspect, the invention features an apparatus, including an interferometer configured to produce an output beam comprising a phase related to an optical path difference between a path of a first beam and a path of a second beam, wherein the first beam contacts a measurement object at a first location, and an electronic controller coupled to the interferometer, wherein during operation the electronic controller determines a position of the measurement object with respect to at least one degree of freedom based on information derived from the output beam and precalibrated information that accounts for contributions to the optical path difference caused by a deviation of the path of the first beam out of a plane defined by a nominal beam path due to an imperfection of the measurement object at the first location.

Embodiments of the apparatus may include one or more of the features of other aspects.

In general, in another aspect, the invention features an interferometry system, including a measurement object, a first interferometer and a second interferometer, the first and second interferometers respectively being configured to produce an output beam comprising a phase related to an optical path difference between a path of a first beam and a path of a second beam, wherein the first beam contacts the measurement object at a first location; and an electronic controller coupled to the interferometer, wherein during operation the electronic controller determines a position of the measurement object with respect to at least one degree of freedom based on information derived from the output beam and precalibrated information that accounts for a misalignment of an axis of the first interferometer relative to an axis of the second interferometer.

Embodiments of the system may include one or more of the features of other aspects.

In another aspect, the invention features a lithography system for use in fabricating integrated circuits on a wafer, the system including a stage for supporting the wafer, an illumination system for imaging spatially patterned radiation onto the wafer, a positioning system for adjusting the position of the stage relative to the imaged radiation, and a foregoing apparatus or system for monitoring the position of the wafer relative to the imaged radiation.

In another aspect, the invention features a lithography system for use in fabricating integrated circuits on a wafer, the system including a stage for supporting the wafer, and an illumination system including a radiation source, a mask, a positioning system, a lens assembly, and a foregoing apparatus or system, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In a further aspect, the invention features a beam writing system for use in fabricating a lithography mask, the system including a source providing a write beam to pattern a substrate, a stage supporting the substrate, a beam directing assembly for delivering the write beam to the substrate, a positioning system for positioning the stage and beam directing assembly relative one another, and a foregoing apparatus or system for monitoring the position of the stage relative to the beam directing assembly.

In another aspect, the invention features a lithography method for use in fabricating integrated circuits on a wafer, the method including supporting the wafer on a moveable stage, imaging spatially patterned radiation onto the wafer, adjusting the position of the stage, and monitoring the position of the stage using the a foregoing method.

In a further aspect, the invention features a lithography method for use in the fabrication of integrated circuits including directing input radiation through a mask to produce spatially patterned radiation, positioning the mask relative to the input radiation, monitoring the position of the mask relative to the input radiation using a foregoing method, and imaging the spatially patterned radiation onto a wafer.

In yet another aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using a foregoing method.

In a further aspect, the invention features a method for fabricating integrated circuits, the method including a foregoing lithography method.

In another aspect, the invention features a method for fabricating integrated circuits, the method including using a foregoing lithography system.

In yet another aspect, the invention features a method for fabricating a lithography mask, the method including directing a write beam to a substrate to pattern the substrate, positioning the substrate relative to the write beam, and monitoring the position of the substrate relative to the write beam using the a foregoing interferometry method.

Embodiments of the invention may include one or more of the following advantages.

Characterizing beam path deviations in interferometers and/or interferometer components using the techniques disclosed herein can be used to improve interferometer accuracy in end-use applications. Accuracy improvement comes from compensating for the contribution of beam path deviations to the optical path difference when determining a degree of freedom (e.g., a displacement or angular orientation) of a measurement object from the interference phase. This also can allow for the use of interferometer and interferometer components in high precision applications where imperfections causing beam path deviations would otherwise render the interferometer and/or components too inaccurate. Accordingly, interferometers and/or components can be used in applications that would otherwise require higher quality components to provide a desired level of accuracy. Because lesser quality components are typically cheaper than high quality counterparts, the techniques can provide a cost savings.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

Other features, objects, and advantages of the invention will be apparent from the following detailed description.

DESCRIPTION OF DRAWINGS

FIG. 3(*b*) is a diagram showing local surface properties of the measurement object in the HSPMI of FIG. 2.

Like reference symbols in the various drawings indicate like elements.

DETAILED DESCRIPTION

Figure 1:
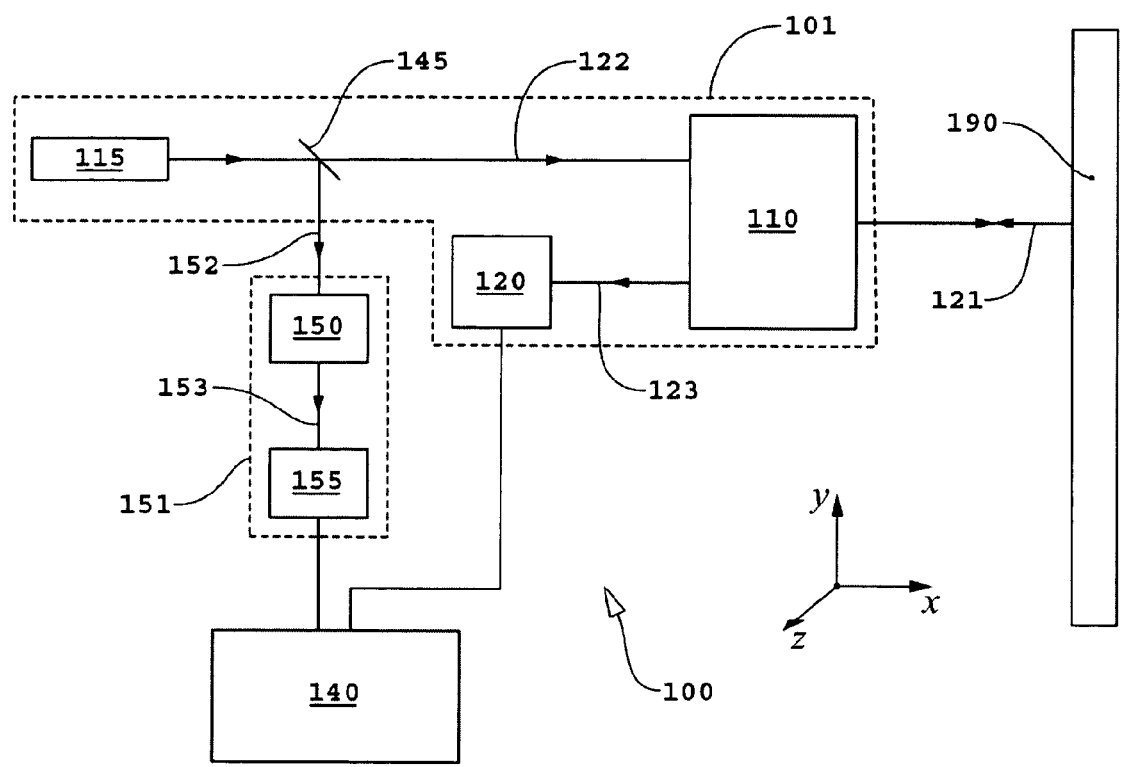
FIG. 1 is a schematic diagram of an embodiment of an interferometry system.

Referring to FIG. 1, an interferometry system 100 includes interferometer subsystems 101 and 151 that are respectively configured to monitor a displacement of a plane mirror measurement object 190 and a beam propagation direction. Subsystem 101 includes an interferometer 110 positioned to receive an input beam 122 from a source 115. Interferometer 110 splits input beam 122 into a measurement beam 121 and a reference beam (not shown), directs measurement beam 121 and the reference beam along different paths, and recombines them to form an output beam 123. Interferometer 110 directs measurement beam 121 to reflect from measurement object 190. Although measurement beam 121 is depicted as making a single pass between measurement object 190 and interferometer 110, in many embodiments it makes multiple passes to the measurement object. Output beam 123 impinges on a detector 120, which detects intensity variations in a polarization component of output beam 123. Detector 120 communicates the time-varying intensity variations to an electronic controller 140 as an interference signal from which electronic controller 140 extracts an interference phase. The interference phase is related to the optical path difference between measurement beam 121 and the reference beam. Subsequently, electronic processor 140 determines a displacement of measurement object 190 relative to interferometer 110 based on a known relationship between the phase, the optical path difference and the relative displacement.

Subsystem 151 includes an angle interferometer 150 and a detector 155. A beam-splitter 145 directs a portion 152 of the beam from light source 115 towards angle interferometer 150, which generates an output beam 153 having an interference phase related to the direction of input beam 122. Detector 155 monitors the intensity of a polarization component of output beam 153 and communicates an interference signal related to the output beam intensity to electronic controller 140. Electronic controller 140 then extracts an interference phase from the interference signal and determines information about the propagation direction of input beam 122 from variations of the interference phase.

Source 115 can be any of a variety of frequency modulation apparatus and/or lasers. For example, the laser can be a gas laser, e.g., a HeNe laser, stabilized in any of a variety of conventional techniques known to those skilled in the art, see for example, T. Baer et al., "Frequency Stabilization of a 0.633 μm He—Ne-longitudinal Zeeman Laser," *Applied Optics*, 19, 3173-3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," *Electronic Letters*, 16, 179-181 (1980) and S. Yamaqguchi and M. Suzuki, "Simultaneous Stabilization of the Frequency and Power of an AlGaAs Semiconductor Laser by Use of the Optogalvanic Effect of Krypton," *IEEE J. Quantum Electronics*, QE-19, 1514-1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225-232 (August 1968); Bagley et al., U.S. Pat. No. 3,656,853, issued Apr. 18, 1972; and H. Matsumoto, "Recent interferometric measurements using stabilized lasers," *Precision Engineering*, 6(2), 87-94 (1984); (2) use of a pair of acousto-optical Bragg cells, see for example, Y. Ohtsuka and K. Itoh, "Two-frequency Laser Interferometer for Small Displacement Measurements in a Low Frequency Range," *Applied Optics*, 18(2), 219-224 (1979); N. Massie et al., "Measuring Laser Flow Fields With a 64-Channel Heterodyne Interferometer," *Applied Optics*, 22(14), 2141-2151 (1983); Y. Ohtsuka and M. Tsubokawa, "Dynamic Two-frequency Interferometry for Small Displacement Measurements," *Optics and Laser Technology*, 16, 25-29 (1984); H. Matsumoto, ibid.; P. Dirksen, et al., U.S. Pat. No. 5,485,272, issued Jan. 16, 1996; N. A. Riza and M. M. K. Howlader, "Acousto-optic system for the generation and control of tunable low-frequency signals," *Opt. Eng.*, 35(4), 920-925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,687,958, issued Aug. 18, 1987; P. Dirksen, et al., ibid.; (4) use of two longitudinal modes of a randomly polarized HeNe laser, see for example, J. B. Ferguson and R. H. Morris, "Single Mode Collapse in 6328 Å HeNe Lasers," *Applied Optics*, 17(18), 2924-2929 (1978); (5) use of birefringent elements or the like internal to the laser, see for example, V. Evtuhov and A. E. Siegman, "A "Twisted-Mode" Technique for Obtaining Axially Uniform Energy Density in a Laser Cavity," *Applied Optics*, 4(1), 142-143 (1965); or the use of the systems described in commonly owned U.S. Pat. No. 6,236,507 B1 entitled "APPARATUS TO TRANSFORM TWO NON-PARALLEL PROPAGATING OPTICAL BEAM COMPONENTS INTO TWO ORTHOGONALLY POLARIZED BEAM COMPONENTS" by Henry A. Hill and Peter de Groot and commonly owned U.S. Pat. No. 6,157,660 entitled "APPARATUS FOR GENERATING LINEARLY-ORTHOGONALLY POLARIZED LIGHT BEAMS" by Henry A. Hill, the contents of both commonly owned patents which are incorporated herewithin in their entirety by way of reference.

The specific device used for source 115 will determine the diameter and divergence of beam 122. For some sources, e.g., a diode laser, it will likely be necessary to use conventional beam shaping optics, e.g., a conventional microscope objective, to provide beam 122 with a suitable diameter and divergence for elements that follow. When the source is a HeNe laser, for example, beam-shaping optics may not be required.

In FIGS. 1-3(b), reference is made to a Cartesian coordinate system such as shown in FIG. 1.

Optimally, the paths of input beam 122, measurement beam 121, and the components of output beam 123 coincide with a nominal beam path. The nominal path corresponds to the path of the beam where the input beam has a fixed orientation relative to a preferred measurement axis of interferometer 110 and the optics making up interferometer 110 and plane mirror measurement object 190 are perfect. The nominal path of the measurement beam (and the measurement beam component of the output beam) is determined according to the orientation of mirror 190 with respect to the interferometer measurement axis. The interferometer measurement axis is parallel to the x-axis. Accordingly, rather than there being one nominal path for the measurement beam, there is a different nominal path for each orientation of the measurement object at each displacement of the measurement object relative to the interferometer.

Due to imperfections in one or more of the optical components (e.g., deviations in the flatness of an optical surface or refractive index variations of a component) or instabilities or misalignment of source 115, the path of input beam 122, measurement beam 121, and/or the components of output beam 123 may deviate from the nominal beam path. These deviations can cause the optical path difference between the measurement beam and reference beam to vary from the optical path difference implied by a relationship such as given by Equation (2) above for a plane mirror interferometer. System 100 accounts for contributions to the optical path difference caused by these deviations by accessing a lookup table that provides correction data parameterized as a function of one or more measurable system parameters, and determines the displacement of the measurement object relative to interferometer 110 based on a corrected optical path difference. Determination of the correct optical path difference is described in detail for a specific interferometer below.

Figure 2:
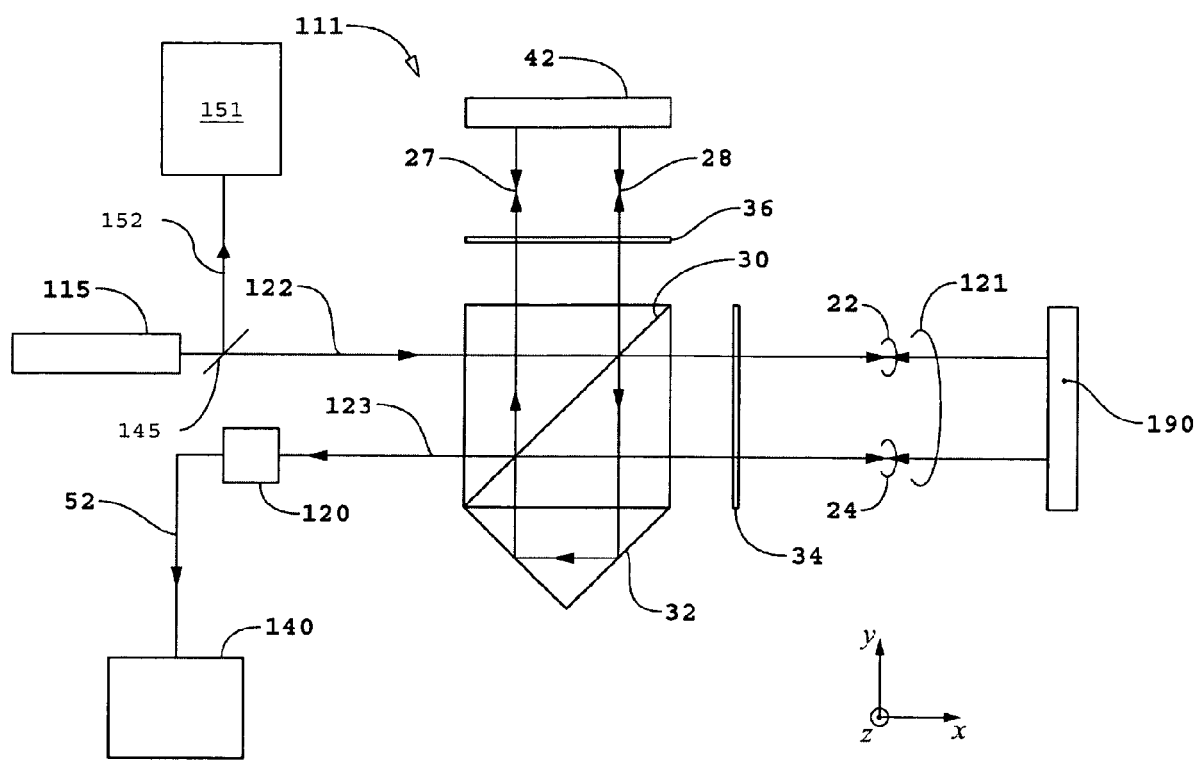
FIG. 2 is a schematic diagram of a high stability plane mirror interferometer HSPMI.

As an example, in some embodiments, interferometer 110 is a high stability plane mirror interferometer (HSPMI). Referring to FIG. 2, an HSPMI 111 includes a polarization beam-splitter 30, a retroreflector 32, quarter wave phase retardation plates 34 and 36, and a plane mirror reference object 42. Input beam 122 is a two-component beam. The two components have different frequencies and are orthogonally plane polarized. The different frequencies can be produced in source 115, for example, by laser Zeeman splitting, by acousto-optical modulation, or internal to the laser using birefringent elements or the like. HSPMI 111 splits input beam 122 into two components. One component, shown as first and second pass measurement beams 22 and 24, reflects from the surface of measurement object 190 twice before exiting HSPMI 111. The other component, shown by first and second pass reference beams 28 and 27, reflect from reference mirror 42 twice before exiting HSPMI 111. The exiting beam components overlap and form output beam 123.

An electrical interference signal 52 is generated by the detection of output beam 123 in detector 120. Detector 120 includes a polarizer to mix the reference and measurement beam components of output beam 123 with respect to polarization. Electrical interference signal 52 contains a heterodyne signal having a heterodyne phase $\Phi$.

Figure 3A:
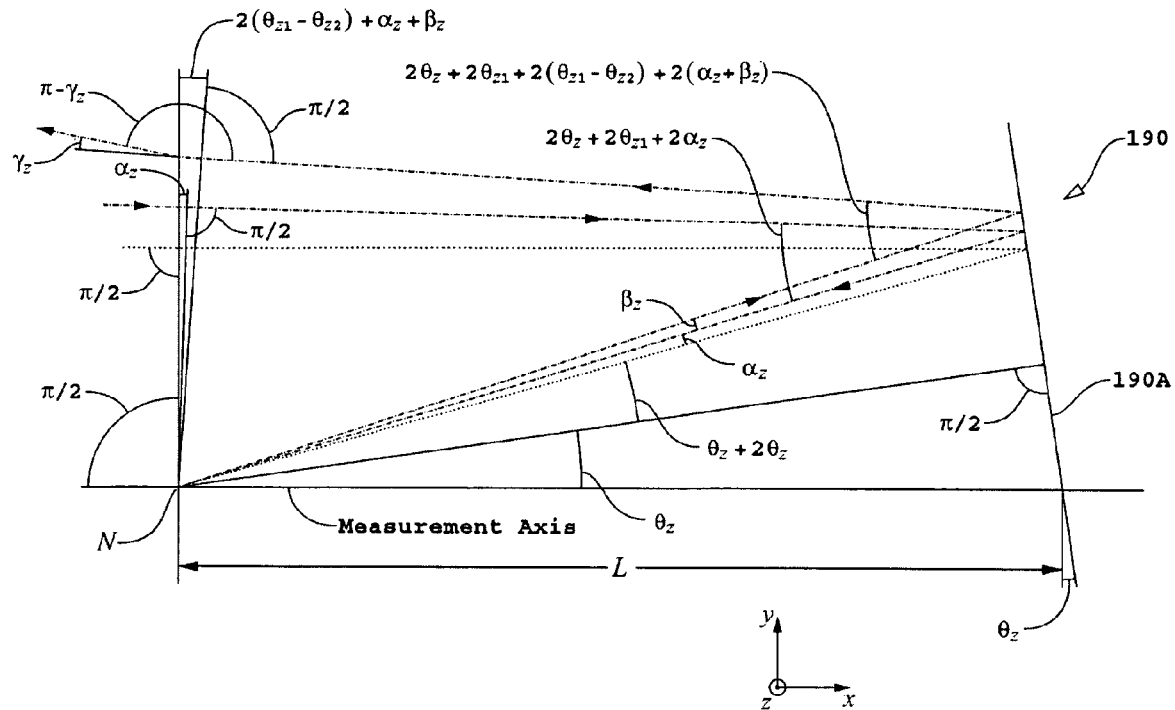
FIG. 3(*a*) is a schematic diagram showing beam path deviations for beams in the HSPMI of FIG. 2.
Figure 3B:
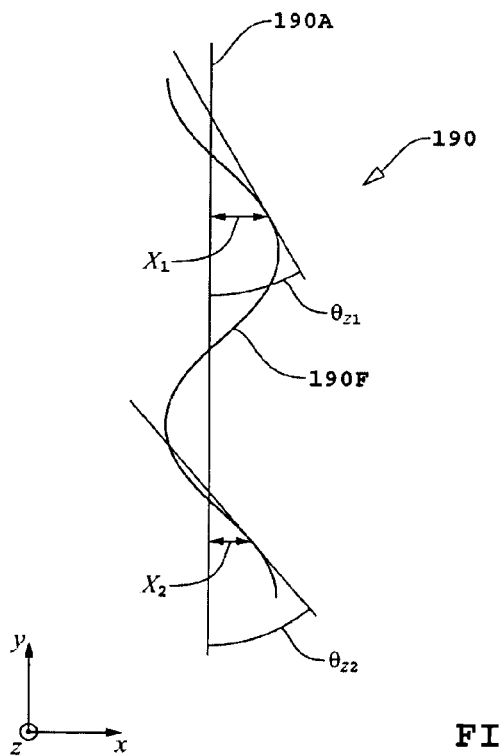

Reference is made to FIG. 3(a) in discussing the relationship between a displacement L to be measured by HSMPI 111 and the measured phase $\Phi$ of the heterodyne signal from HSPMI 111. Phase $\Phi$ is expressed as the sum of three phases $\Phi_M$, $\Phi_S$, and $\Phi_R$, i.e., $$\Phi = \Phi_M + \Phi_S - \Phi_R \quad (4)$$

where $\Phi_M$ is the contribution to phase $\Phi$ from the measurement beam path in HSMPI 111, $\Phi_S$ is the phase contribution introduced by a relative lateral shear of the measurement and reference beam components of output beam 123 and a relative difference in directions of propagation of the measurement and reference beam components of output beam 123, and $\Phi_R$ is the contribution to phase $\Phi$ from the reference beam path in HSMPI 111. With reference to FIGS. 3(a) and 3(b), phases $\Phi_M$ and $\Phi_S$ are given to a good approximation by the equations $$\Phi_M = kL\cos\theta_z\cos\theta_y \left[ \frac{1}{\cos(\alpha_y + \theta_y + 2\theta_{1y})\cos(\alpha_z + \theta_z + 2\theta_{1z})} + \frac{\cos(\alpha_y + 2\theta_y + 2\theta_{1y})\cos(\alpha_z + 2\theta_z + 2\theta_{1z})}{\cos(\alpha_y)\cos(\alpha_y + \theta_y + 2\theta_{1y})\cos(\alpha_z)\cos(\alpha_z + \theta_z + 2\theta_{1z})} + \frac{1}{\cos(\alpha_y + \beta_y + \theta_y + 2\theta_{1y})\cos(\alpha_z + \beta_z + \theta_z + 2\theta_{1z})} + \frac{\cos(\alpha_y + \beta_y + 2\theta_y + 2\theta_{1y})}{\cos(\alpha_y + \beta_y + \theta_y + 2\theta_{1y})\cos(\alpha_y + \beta_y + 2(\theta_{1y} - \theta_{2y}))} \times \frac{\cos(\alpha_z + \beta_z + 2\theta_z + 2\theta_{1z})}{\cos(\alpha_z + \beta_z + \theta_z + 2\theta_{1z})\cos(\alpha_z + \beta_z + 2(\theta_{1z} - \theta_{2z}))} \right] \quad (5)$$

$$L_D \frac{1}{\cos(\alpha_y + \beta_y + \gamma_y + 2(\theta_{1y} - \theta_{2y}))\cos(\alpha_z + \beta_z + \gamma_z + 2(\theta_{1z} - \theta_{2z}))} + 2(X_1 + X_2)$$

-continued $$\Phi_S = \frac{kL}{4} \begin{Bmatrix} (\alpha_z + \beta_z + \gamma_z + 2(\theta_{1z} - \theta_{2z}) + \alpha_{zR} + \beta_{zR} + \gamma_{zR} + 2(\theta_{1zR} - \theta_{2zR})) \times \\ \begin{bmatrix} -(4\alpha_z + 2\beta_z + 6\theta_{1z} - 2\theta_{2z} + 4\theta_z) + (L_R/L)(4\alpha_{zR} + \\ 2\beta_{zR} + 6\theta_{1zR} - 2\theta_{2zR} + 4\theta_{zR}) - \xi((\alpha_z - \alpha_{zR}) + \\ (\beta_z - \beta_{zR}) + (\gamma_z - \gamma_{zR}) + 2(\theta_{1z} - \theta_{2z}) - 2(\theta_{1zR} - \theta_{2zR})) \end{bmatrix} + \\ (\alpha_y + \beta_y + \gamma_y + 2(\theta_{1y} - \theta_{2y}) + \alpha_{yR} + \beta_{yR} + \gamma_{yR} + 2(\theta_{1yR} - \theta_{2yR})) \times \\ \begin{bmatrix} -(4\alpha_y + 2\beta_y + 6\theta_{1y} - 2\theta_{2y} + 4\theta_y) + (L_R/L)(4\alpha_{yR} + \\ 2\beta_{yR} + 6\theta_{1yR} - 2\theta_{2yR} + 4\theta_{yR}) - \xi((\alpha_y - \alpha_{yR}) + \\ (\beta_y - \beta_{yR}) + (\gamma_y - \gamma_{yR}) + 2(\theta_{1y} - \theta_{2y}) - 2(\theta_{1yR} - \theta_{2yR})) \end{bmatrix} \end{Bmatrix}$$
(6)

where L is the distance between point N which depends on the refractive indices of the media in the measurement beam path, the conjugate of the nodal point of retroreflector 32 as seen through polarization beam-splitter 30, and surface 190A of object mirror 190 along a measurement axis as defined for interferometer 111; $L_R$ is the distance between point N and the reference mirror 42 along a measurement axis as defined for interferometer 111; k is a wavenumber corresponding to wavelength λ of source 115; $\theta_z$ and $\theta_y$ are the rotations of surface 190A of object mirror 190 about z and y axes, respectively; $\theta_{z1}$ and $\theta_{z2}$ are the local slopes of surface 190F of object mirror 190 measured in the x-y plane at the positions where the first and second pass measurement beams 22 and 24, respectively, contact object mirror 190; $\theta_{y1}$ and $\theta_{y2}$ are the local slopes of surface 190F of object mirror 190 measured in the x-z plane at the positions where the first and second pass measurement beams 22 and 24, respectively, contact object mirror 190; $\alpha_z$ and $\alpha_y$ are deviations in the direction of the input beam with respect to the interferometer measurement axis in the x-y and x-z planes (measured by angle interferometer subsystem 151), respectively; $\beta_z$ and $\beta_y$ are deviations in the direction of the component of second pass measurement beam 24 propagating toward object mirror 190 with respect to the direction of propagation of the component of the first pass measurement beam 22 propagating toward HSMPI 111 in the x-y and x-z planes, respectively; $\gamma_z$ and $\gamma_y$ are deviations in the direction of the measurement beam component of output beam 123 with respect to the direction of component of the second pass measurement beam 24 propagating toward HSPMI 111 in the x-y and x-z planes, respectively; the terms $X_1$ and $X_2$ are the local displacements surface 190F from surface 190A of object mirror 190 measured in the x-y plane at the positions where the first and second pass measurement beams 22 and 24, respectively, contact object mirror 190; and ξ is the ratio of the beam path length $L_D$ between the conjugate nodal point of HSPMI 111 and the photosensitive surface of detector 120 and the measurement beam path length between HSMPI 111 and measurement object 190 (which is L). The terms that have a subscript R represent parameters associated with the reference beam, e.g., the term $(\theta_z)_R$ in Equation (6) represents the rotation about the z axis of the conjugate of reference mirror 42 located in the space of measurement beam 121 and nominally parallel to surface 190A of object mirror 190.

The location of the conjugate of the nodal point of retroreflector 32 is displaced from the conjugate of the apex of retroreflector 32 as seen through polarization beam-splitter 30 depending on the physical path length of the measurement path in polarization beam-splitter 30 and retroreflector 32 and magnitude of the index of refraction of polarization beam-splitter 30 and retroreflector 32. The nodal point refers to the location of the image of the vertex of retroreflector 32 as seen from outside the retroreflector. The value for L may be written for example as $$L = n_a l_M + \frac{n_a^2 l_{M,I}}{n_I}$$
(7)

where $l_M$ is the one way physical path length of the measurement path in air for $\theta_y=0$ and $\theta_z=0$, $n_I$ is the refractive index of the glass portion of an interferometer comprising a single medium, and $l_{M,I}$ is the one way physical path length of the measurement beam in the glass portion of the interferometer for $\theta_y=0$ and $\theta_z=0$. The length $l_{M,I}$ corresponds to the respective physical path length of a beams at $\theta_y=0$ and $\theta_z=0$, respectively, measured from the apex of retroreflector 32.

Surface 190F of object mirror 190 corresponds to the physical surface of object mirror 190 and can be characterized by techniques described subsequently. Surface 190A of object mirror 190 represents an average of the physical surface 190F according to an algorithm such as a least-squares fit. In preferred embodiments, the characterization of the object mirror surface has a resolution on the order of, or greater than, the resolution of the measurement beam diameter.

An equation for $\Phi_R$ is of the same general form as that of the equation given for $\Phi_M$, i.e., Equation (5). The corresponding equation $\Phi_R$ may be used to evaluate non-linear errors that arise from the reference beam path in an end use application such as an interferometer configured with a column reference, where a polarization leakage filter is used such as described in Provisional Patent Application No. 60/303,299 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," to Peter de Groot et al. and its corresponding utility application U.S. patent application Ser. No. 10/174,149, or where elements of the interferometer are rotated or tilted to eliminate certain cyclic non-linear errors such as described in Provisional Patent Application No. 60/314,490 entitled "TILTED INTERFEROMETER" to Henry A. Hill and its corresponding utility application U.S. patent application Ser. No. 10/218,965. The contents of both cited Provisional Patent Applications and both Utility U.S. Patent Applications are hereby incorporated by reference in their entirety.

The differences $\delta_z$ and $\delta_y$ in the directions of propagation of measurement and reference beam components of output beam 123 in the x-y and x-z planes, respectively, are $$\delta_z = [2(\theta_{z1} - \theta_{z2}) - 2(\theta_{z1} - \theta_{z2})_R + (\alpha_z - \alpha_{zR}) + (\beta_z - \beta_{zR}) + (\gamma_z - \gamma_{zR})]$$
(8)

$$\delta_y = [2(\theta_{y1} - \theta_{y2}) - 2(\theta_{x1} - \theta_{x2})_R + (\alpha_y - \alpha_{yR}) + (\beta_y - \beta_{yR}) + (\gamma_y - \gamma_{yR})] \quad (9)$$

Note, for example, that where $\theta_{z1} = \theta_{z2}$, the contributions to $\delta_z$ due to variations in the slope of the stage mirror in the x-y plane at the points at which the measurement beam contacts the stage mirror cancel each other out.

The subsequent description of Equation (4) is in terms of the contributions that arise from $\Phi_M$ and $\Phi_S$ since, as noted above, the description of the contribution of $\Phi_R$ is the same as the corresponding portion of the description of the contribution of $\Phi_M$. The contributions of $\Phi_M$ and $\Phi_S$ given by Equations (5) and (6) may be expanded in a power series as $$\frac{\Phi_M + \Phi_S}{k} = L \left\{ \begin{array}{c} 4 - 4\theta_z^2 + 2(\theta_{1z} - \theta_{2z})^2 + 4\theta_{1z}^2 + \alpha_z^2 - 2\theta_{2z}(\alpha_z + \beta_z) + \\ (\alpha_z + \beta_z)^2 + \theta_{1z}(6\alpha_z + 4\beta_z) - \\ \frac{1}{2}(\alpha_z + \beta_z + \gamma_z + 2(\theta_{1z} - \theta_{2z})) \\ (4\alpha_z + 2\beta_z + 6\theta_{1z} - 2\theta_{2z} + 4\theta_z) - \\ 4\theta_y^2 + 2(\theta_{1y} - \theta_{2y})^2 + 4\theta_{1y}^2 + \alpha_y^2 - 2\theta_{2y}(\alpha_y + \beta_y) + \\ (\alpha_y + \beta_y)^2 + \theta_{1y}(6\alpha_y + 4\beta_y) - \\ \frac{1}{2}(\alpha_y + \beta_y + \gamma_y + 2(\theta_{1y} - \theta_{2y})) \\ (4\alpha_y + 2\beta_y + 6\theta_{1y} - 2\theta_{2y} + 4\theta_y) \end{array} \right\} + 2(X_1 + X_2) \quad (10)$$

wherein the leading terms have been retained up through quadratic terms and $L_D$ terms cancel out. In order to make the contributions of the deviations from the nominal path more easily identifiable, Equation (10) may be rewritten as $$\frac{\Phi_M + \Phi_S}{k} = +4L \left\{ \begin{array}{c} 1 - \left\{ \theta_z + \frac{1}{4}[\alpha_z + \beta_z + \gamma_z + 2(\theta_{z1} - \theta_{z2})] \right\}^2 - \\ \left\{ \theta_y + \frac{1}{4}[\alpha_y + \beta_y + \gamma_y + 2(\theta_{y1} - \theta_{y2})] \right\}^2 + \\ \frac{1}{16}(\alpha_z + \beta_z + \gamma_z + 2(\theta_{1z} - \theta_{2z}))^2 + \frac{1}{16}(\alpha_y + \beta_y + \gamma_y + 2(\theta_{y1} - \theta_{y2}))^2 + \\ \frac{1}{2}(\theta_{z1} - \theta_{z2})^2 + \theta_{z1}^2 + \frac{1}{4}\alpha_z^2 - \frac{1}{2}\theta_{z2}(\alpha_z + \beta_z) + \frac{1}{4}(\alpha_z + \beta_z)^2 + \\ \frac{1}{2}\theta_{z1}\left(\frac{3}{2}\alpha_z + \beta_z\right) - \frac{1}{4}(\alpha_z + \beta_z + \gamma_z + 2(\theta_{1z} - \theta_{2z}))(2\alpha_z + \beta_z + 3\theta_{z1} - \theta_{z2}) + \\ \frac{1}{2}(\theta_{y1} - \theta_{y2})^2 + \theta_{y1}^2 + \frac{1}{4}\alpha_y^2 - \frac{1}{2}\theta_{y2}(\alpha_y + \beta_y) + \frac{1}{4}(\alpha_y + \beta_y)^2 + \\ \frac{1}{2}\theta_{y1}\left(\frac{3}{2}\alpha_y + \beta_y\right) - \frac{1}{4}(\alpha_y + \beta_y + \gamma_y + \\ 2(\theta_{y1} - \theta_{y2}))(2\alpha_y + \beta_y + 3\theta_{y1} - \theta_{y2}) \end{array} \right\} + 2(X_1 + X_2). \quad (11)$$

According to Equation (11), the effects of the deviations are equivalent to a change in the directions of the effective measurement axis in the x-y and x-z planes by $\eta_z$ and $\eta_y$, respectively, with $$\eta_z = \frac{1}{4}(\alpha_z + \beta_z + \gamma_z + 2(\theta_{z1} - \theta_{z2})), \quad (12)$$

$$\eta_y = \frac{1}{4}(\alpha_y + \beta_y + \gamma_y + 2(\theta_{y1} - \theta_{y2})), \quad (13)$$

and to change the effective scale or equivalent wavelength by a factor $\zeta$ where $$\zeta = \quad (14)$$

$$1 + \frac{1}{16}(\alpha_z + \beta_z + \gamma_z + 2(\theta_{z1} - \theta_{z2}))^2 + \frac{1}{4}\{2(\theta_{z1} - \theta_{z2})^2 + 4\theta_{z1}^2 + \alpha_z^2 -$$

$$2\theta_{z2}(\alpha_z + \beta_z) + (\alpha_z + \beta_z)^2 + \theta_{z1}(6\alpha_z + 4\beta_z)\} -$$

$$\frac{1}{8}(\alpha_z + \beta_z + \gamma_z + 2(\theta_{z1} - \theta_{z2}))(4\alpha_z + 2\beta_z + 6\theta_{z1} - 2\theta_{z2}) +$$

-continued $$\frac{1}{16}(\alpha_y + \beta_y + \gamma_y + 2(\theta_{y1} - \theta_{y2}))^2 +$$

$$\frac{1}{4}\{2(\theta_{y1} - \theta_{y2})^2 + 4\theta_{y1}^2 + \alpha_y^2 - 2\theta_{y2}(\alpha_y + \beta_y) +$$

$$(\alpha_y + \beta_y)^2 + \theta_{y1}(6\alpha_y + 4\beta_y)\} -$$

$$\frac{1}{8}(\alpha_y + \beta_y + \gamma_y + 2(\theta_{y1} - \theta_{y2}))(4\alpha_y + 2\beta_y + 6\theta_{y1} - 2\theta_{y2})$$

Thus, to account for contributions to the optical path difference due to deviations of the input and/or measurement beam paths from a nominal path, Equation (2) can be re-expressed as $$\Phi = 2pkL\zeta[1-(\theta_z+\eta_z)^2-(\theta_y+\eta_y)^2]+2k(X_1+X_2) \quad (15)$$

where terms are retained up to quadratic order and the terms arising from the reference beam path have been omitted. The terms arising from the reference beam may be added as required according the described procedure.

The systematic effects of departures of surface 190F from a plane surface 190A on the direction of the measurement axis as represented by $\eta_z$ and $\eta_y$ given by Equations (12) and (13) are dependent on the approximate second order spatial derivative of the profile of surface 190F, i.e., $(\theta_{z1}-\theta_2)$ and $(\theta_{y1}-_{y2})$. This is to be contrasted with the systematic effect of a rotation of mirror object 190 which depends on the first order spatial derivative or gradient of the surface 190A, e.g., $\theta_z$ and $\theta_y$. The lack of symmetry with respect to the two systematic effects is because changes in $\theta_z$ and $\theta_y$ represent rotations of mirror object 190 as a solid body while the rotation specified for example by $\theta_{z1}$ represents a local rotation of a portion of mirror object 190. The lack of symmetry with respect to the two systematic effects may also be understood as associated with the respective different points of rotation of mirror object 190, e.g., the point of rotation associated with $\theta_z$ and $\theta_y$ is at the intersection of the measurement axis and surface 190A and the point of local rotation associated with $\theta_{z1}$, for example, corresponds to the intersection of the path of first pass measurement beam 22 with surface 190F.

The systematic effects of the approximate second order spatial derivative of surface 190F can result in high precision specifications for the surface of mirror objects in certain end use applications. As an example, consider an application where the desired accuracy of a linear displacement measurement is 0.1 nm, the value of the measurement path L=0.7 m, ξ=1.1, and $\theta_z$=0.5 millirad. For a deformation of surface 190F with an amplitude α and a spatial wavelength Λ=1 cm, the subsequent specification on a is $$a \leq 0.2 \text{ nm} \quad (16)$$

or $a \leq \lambda/3000$ for $\lambda$=633 nm. The effects of spatial wavelengths greater than or of the order of the $1/e^2$ diameter of the measurement beams will not be eliminated by integration over the photosensitive area of detector 120. A general expression for the specification on the amplitude a in terms L, $\theta = (\theta_z^2+\theta_y^2)^{1/2}$, a separation d between the first and second pass measurement beams 22 and 24, ξ, and Λ for an error of ε in a linear displacement is $$a \leq \left(\frac{\varepsilon}{4\pi\xi L\theta}\right)\left(\frac{\Lambda}{\sin(\pi d/\Lambda)}\right). \quad (17)$$

Note that while errors $\delta_z$ and $\delta_y$ may effect the magnitude of the heterodyne signal of signal 52 because these errors are related to the extent to which the measurement and reference beam components in the output beam overlap, the magnitude of the heterodyne signal alone may not be an accurate indication of beam path deviations. This is because although $\delta_z$ and $\delta_y$ may be substantially zero, other components of ζ, $\eta_z$, and $\eta_y$, may still contribute to the optical path difference.

Deviations $\alpha_z$ and $\alpha_y$ are typically a function of the stability and alignment of source 115 and a respective beam system. Angle interferometer 150 (shown in FIG. 1) provides a measure of $\alpha_z$, while a similar angle interferometer (not shown) oriented orthogonally to angle interferometer 150 can provide a measure of $\alpha_y$. In embodiments where source 115 and beam delivery system are sufficiently stable, interferometry system 100 need not include subsystem 151, and $\alpha_z$ and $\alpha_y$ can be re-calibrated as necessary during periodic system maintenance.

Angle interferometers are also sometimes referred to as angular displacement interferometers or angle measuring interferometers. Examples of angle interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272, 034. The entire contents of the aforementioned applications disclosing examples of angle interferometers and differential angular displacement interferometers are hereby incorporated by reference.

Referring to FIG. 4-FIG. 8, one example of an angle interferometer system is interferometer system 500 which makes angle measurements in one plane of the average direction of propagation of beam 512 relative to a predefined optical axis. Angle interferometer system 500 includes angle interferometer 501, detector 560, and electronic processor 570. Angle interferometer 501 includes a beam-shearing assembly, generally shown at element numeral 530, an analyzer 540, and lens 546. For heterodyne interferometry, input beam 512 includes two orthogonally polarized optical beam components having a difference in frequencies of $f_1$. The planes of polarization of the two orthogonally polarized components are parallel and orthogonal to the plane of FIG. 4, respectively.

Figure 4:
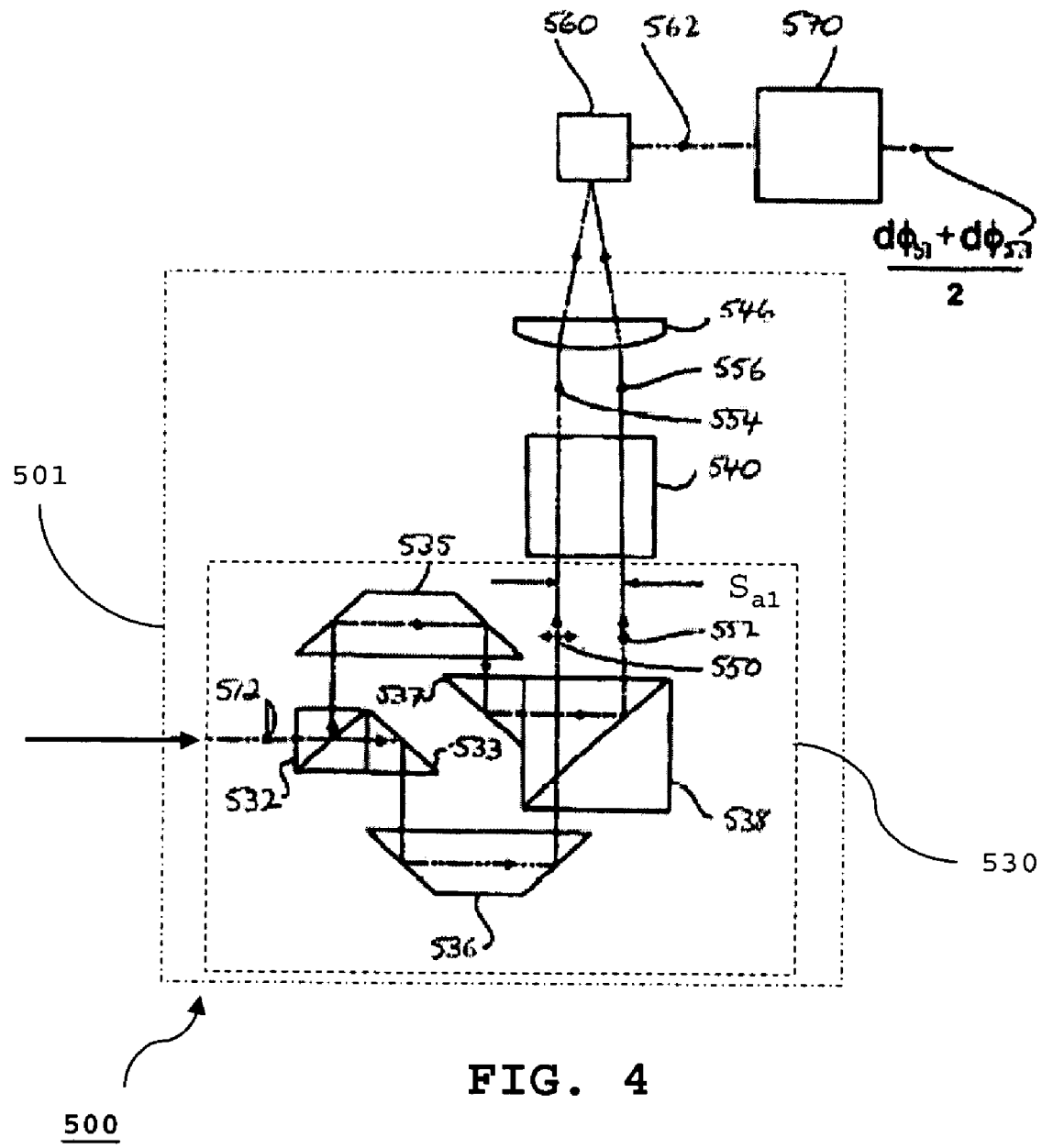
FIG. 4 is a schematic diagram of an embodiment of an angle interferometer.

Beam-shearing assembly 530 introduces a lateral shear $S_{a1}$ between the two orthogonally polarized beams 550 and 552, respectively (see FIG. 4). A portion of each of the spatially sheared output beams 550 and 552 are transmitted by analyzer 540 as components 554 and 556, respectively. Analyzer 540 is orientated so that beam components 554 and 556 are both polarized in a common plane orientated at 45 degrees to the plane of FIG. 4.

Next, beam components 554 and 556 are incident on lens 546 wherein lens 546 focuses beam components 554 and 556 to spots on detector 560 to be detected preferably by a quantum photon detector to generate electrical interference signal 562 or heterodyne signal $s_1$. The spots substantially overlap. Heterodyne signal $s_1$ is transmitted to electronic processor 570 for determination of the heterodyne phase of signal $s_1$ and a corresponding average direction of propagation of beam 512 in the plane of FIG. 4.

Beam-shearing assembly 530 includes polarizing beam-splitters 532 and 538, right angle prisms 533 and 537, and truncated Porro prisms 535 and 536. The component of beam 512 polarized in the plane of FIG. 4 is transmitted by polarizing beam-splitter 532, reflected by right angle prism 533, redirected by truncated Porro prism 536, and reflected by polarizing beam-splitter 538 as beam 550. The component of beam 512 polarized orthogonal to the plane of FIG.

4 is reflected by polarizing beam-splitter 532, redirected by truncated Porro prism 535, reflected by right angle prism 537, and transmitted by polarizing beam-splitter 538 as beam 552.

Note that the optical path in glass for each of beams 554 and 556 through beam-shearing assembly 530 and analyzer 540 are preferably the same. This feature of the apparatus design produces a high stability interferometer system with respect to changes in temperature.

Heterodyne signal $s_1$ may be written as $$s_1 = A_1 \cos(\omega_1 t + \phi_1 + \zeta_1) \tag{18}$$

where $$\phi_1 = 2k_1 n[d_1 \cos\theta_1' + d_2 \cos\theta_2' - d_3 \cos\theta_3' - d_4 \cos\theta_4'], \tag{19}$$

Figure 5:
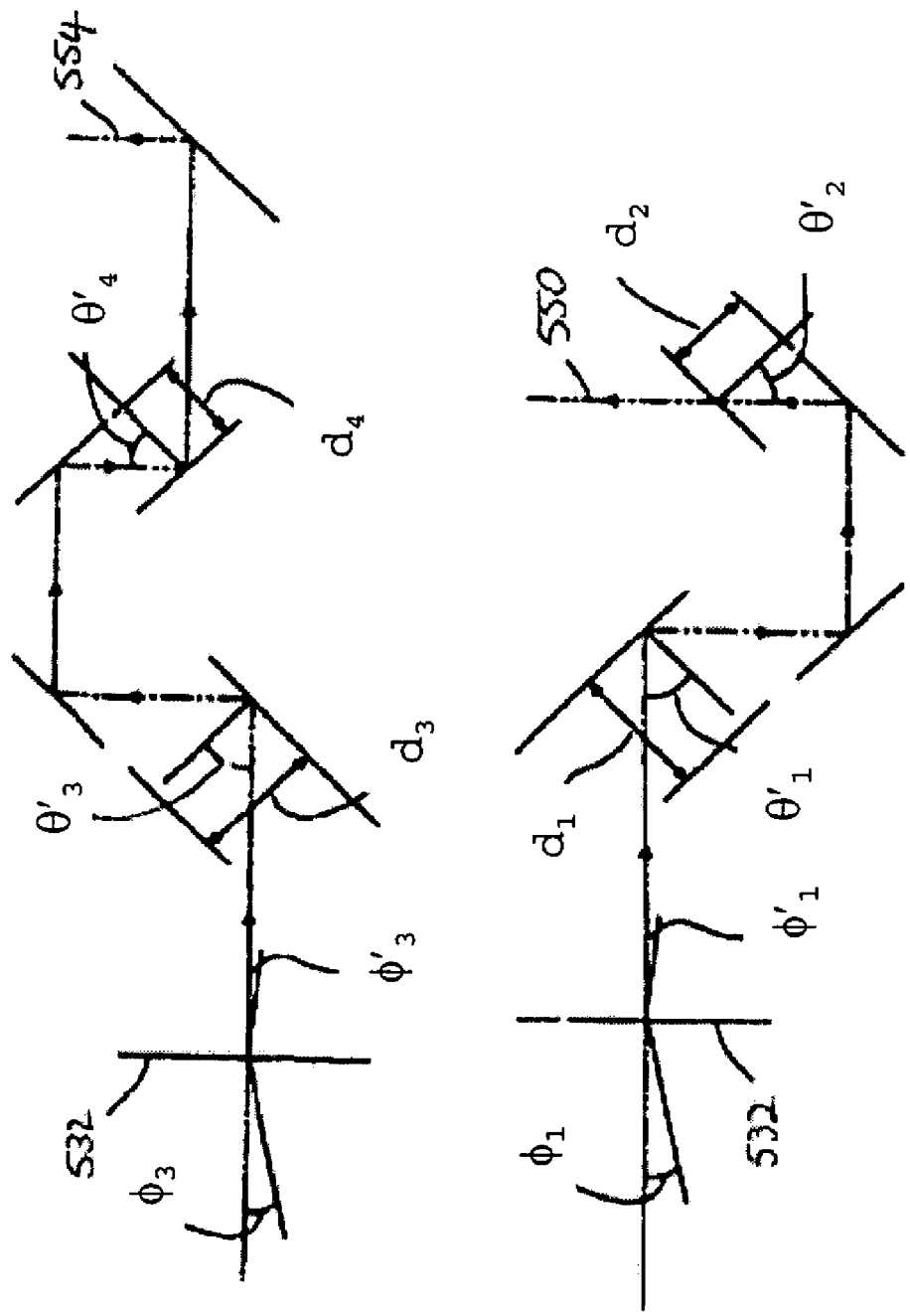
FIG. 5 is a schematic diagram showing the path of a beam through portions of the angle interferometer shown in FIG. 4.

$\omega_1 = 2\pi f_1$, $\zeta_1$ is an offset phase not associated with phase $\phi_1$, $k_1 = 2\pi/\lambda_1$, $\lambda_1$ is the wave length of input beam 512, $\theta_1'$ and $\theta_2'$ are angles of incidence of beam 550 at right angle prism 533 and at the polarizing beam-splitter 538, respectively, $\theta_3'$ and $\theta_4'$ are angles of incidence of beam 552 at polarizing beam-splitter 532 and at right angle prism 537, respectively, and $d_1$, $d_2$, $d_3$, and $d_4$ are defined in FIG. 5. It has been assumed in Equation (19) for the purposes of demonstrating the features of the present invention in a simple fashion without departing from the scope and spirit of the present invention that all of the optical paths in beam-shearing assembly 30 have the same index of refraction. For a non-limiting example of $d_1 = d_3$, $d_2 = d_4$, $\theta_1' + \theta_2' = \pi/2$, and $\theta_3' + \theta_4' = \pi/2$, Equation (19) reduces to the simpler expression for $\phi_1$, $$\varphi_1 = 2^{1/2} k_1 n[(d_1 - d_2)[\cos(\theta_1' + \pi/4) + \cos(\theta_4' + \pi/4)] + \tag{20}$$
$$(d_1 + d_2)[\sin(\theta_1' + \pi/4) - \sin(\theta_4' + \pi/4)]].$$

Lateral shear $S_{a1}$ is related to properties of beam-shearing assembly 530 according to the equation $$S_{a1} = 2\left[\begin{array}{c}(d_1\sin\theta_1' - d_2\sin\theta_2')\sec\phi_1'\cos\phi_1 + \\ (d_3\sin\theta_3' - d_4\sin\theta_4')\sec\phi_3'\cos\phi_3\end{array}\right] \tag{21}$$

where $\phi_1$ and $\phi_1'$ are the angles of incidence and refraction of beam 550 at entrance facet of polarizing beam-splitter 532 and $\phi_3$ and $\phi_3'$ are the angles of incidence and refraction of beam 552 at entrance facet of polarizing beam-splitter 532 (see FIG. 5). For the non-limiting example, $$S_{a1} = 2^{1/2} \left\{ (d_1 - d_2)\left[\begin{array}{c}\sin(\theta_1' + \pi/2)\sec\phi_1'\cos\phi_1 + \\ \sin(\theta_4' + \pi/2)\sec\phi_3'\cos\phi_3\end{array}\right] + \right. \tag{22}$$
$$\left. (d_1 + d_2)\left[\begin{array}{c}\sin(\theta_1' - \pi/2)\sec\phi_1'\cos\phi_1 - \\ \sin(\theta_4' - \pi/2)\sec\phi_3'\cos\phi_3\end{array}\right]\right\}.$$

The expression given for $S_{a1}$ by Equations (21) and (22) represent the primary mechanism used for generation of the beam shear. However, there are other mechanisms for introducing a beam shear such as associated with angle of incidence dependent phase shifts (e.g., Goos-Hänchen effect).

Figure 6:
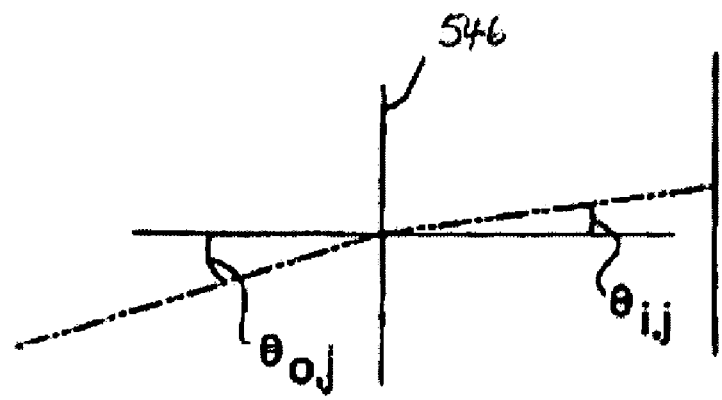
FIG. 6 and FIG. 7 are schematic diagrams showing the path of a beam through other portions of the angle interferometer shown in FIG. 4.
Figure 7:
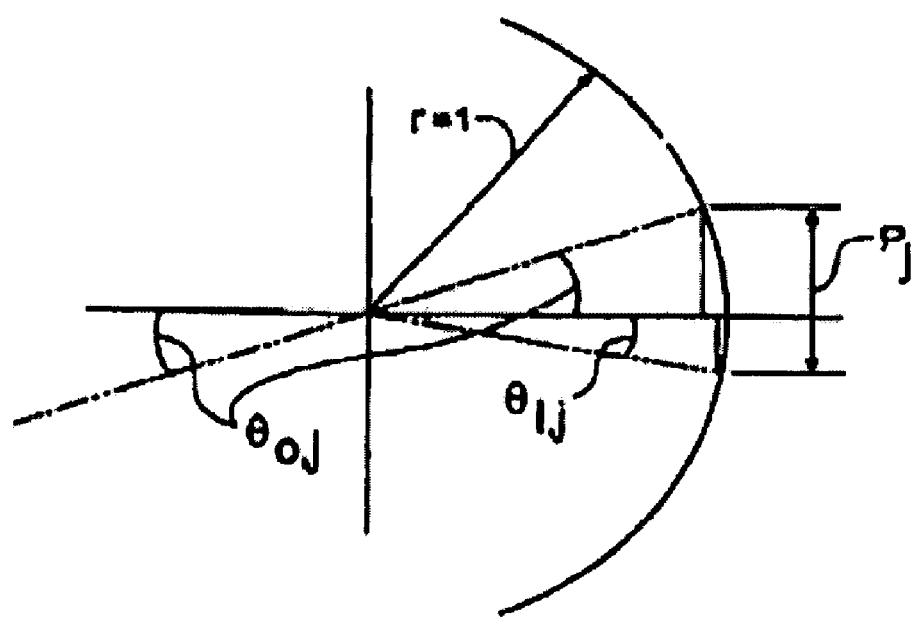

Amplitude $A_1$ is proportional to a good approximation to a Fourier component of the Fourier transform of $|h(p_1)|^2$, i.e., $$A_1 \propto \int |h(p_1)|^2 \cos[4k_1 p_1 S_1] dp_1 \tag{23}$$

where $h(p_1)$ is the Fourier transform of the amplitude of one of the beams 554 or 556 at lens 546 multiplied by the pupil function of lens 546, $$p_j = \sin\theta_{o,j} + \sin\theta_{i,j}, j = 1, 2, \ldots, \tag{24}$$

and the definition of $\theta_{o,j}$ and $\theta_{i,j}$ are shown in FIG. 6. Angles $\theta_{o,j}$ and $\theta_{i,j}$ are conjugate angles of principle rays of beam j in the object and image space of lens 546. The definition of $p_j$ is shown in FIG. 7.

It is evident from Equations (19) and (20) that the resolution of phase $\phi_1$ in terms of a change in a direction of an optical beam is increased as the length $2^{3/2}(d_1 - d_2)$ is increased. However, the usable range for $2^{3/2}(d_1 - d_2)$ is defined by the spatial frequency bandwidth of the Fourier transform of $|h(p_1)|^2$ as shown by Equation (23).

The optimum value for $2^{3/2}(d_1 - d_2)$ is generally equal to approximately one half a characteristic spatial dimension of a beam transmitted by a respective pupil. Consider, for example, the case of a rectangular pupil of dimension b in the plane of FIG. 4 for both beam 554 and beam 556 at lens 546 and the amplitudes of beams 554 and 556 being uniform across respective pupils. For this case, $|h(p_1)|^2$ is a sinc function squared, i.e., $(\sin x/x)^2$, and the Fourier transform of $|h(p_1)|^2$ is a triangle function, $\Delta$. Triangle function, $\Delta$, has a maximum value of 1 for $2^{3/2}(d_1 - d_2) = 0$ and has a value of 0 for $2^{3/2}(d_1 - d_2) \geq b$. Therefore, amplitude $A_1 = 0$ for $2^{3/2}(d_1 - d_2) \geq b$ and the resolution of phase $\phi_1$ in terms of a change in a direction of an optical beam is 0 for $2^{3/2}(d_1 - d_2) = 0$. Thus the optimum value for $2^{3/2}(d_1 - d_2)$ is in this case approximately $b/2$. The actual optimum value for $2^{3/2}(d_1 - d_2)$ will depend on the criterion used to define an optimum operating condition with respect to a signal-to-noise ratio, for example. For the case where the components of beam 512 have Gaussian intensity profiles, the optimum value for $2^{3/2}(d_1 - d_2)$ will be approximately w where w is the radius at which the intensity of beam 512 has a value equal to 1/e of the intensity at beam 512 at its center.

For an example of a beam having a Gaussian intensity profile with $2w = 5.0$ mm, $\theta_1 = 45$ degrees, and $\lambda_1 = 633$ nm, the sensitivity of the phase $\phi_1$ to changes in $d\phi_1$ and $d\phi_3$ expressed in differential form is given by the equation $$d\varphi_1 = k_1 w \left[\frac{d\phi_1 + d\phi_3}{2}\right] \tag{25}$$
$$= -2.5 \times 10^4 \left[\frac{d\phi_1 + d\phi_3}{2}\right].$$

Note, as evident from Equation (25), that the sensitivity of the change in phase $\phi_1$ with respect to changes in angles $d\phi_1$ and $d\phi_3$ is independent of the index of refraction n. This is an important property of the first embodiment of the angle interferometer. In particular, the sensitivity of the change in phase $\phi_1$ with respect to changes in angles $d\phi_1$ and $d\phi_3$ has a sensitivity to temperature changes that is independent in first order to thermal induced changes in the refractive index of the optical elements of beam-shearing assembly 530 and only dependent on thermal coefficients of expansion of the optical elements of beam-shearing assembly 530. The thermal coefficients of the elements of beam-shearing assembly 530 can be selected to be less than $\leq 0.5$ ppm/° C. For similar reasons, the zero value of $\phi_1$ also exhibits a corresponding low sensitivity to changes in temperature of beam-shearing assembly 530.

The two primary quantities that place restrictions on the range of average value $[d\phi_1+d\phi_3]/2$ that can be accommodated by the first embodiment are the magnitude of the difference $[d\phi_1-d\phi_3]/2$ and the size of the sensitive area of detector 560. The amplitude of the heterodyne signal will be reduced by a factor of approximately 2 when $$wk_1\left[\frac{[d\phi_1 - d\phi_3]}{2}\right] \approx 1.$$

The higher terms in $d\phi_1$ and $d\phi_3$ that are omitted in Equation (25) can be easily determined from Equation (19) if required for a particular end use application.

Figure 8:
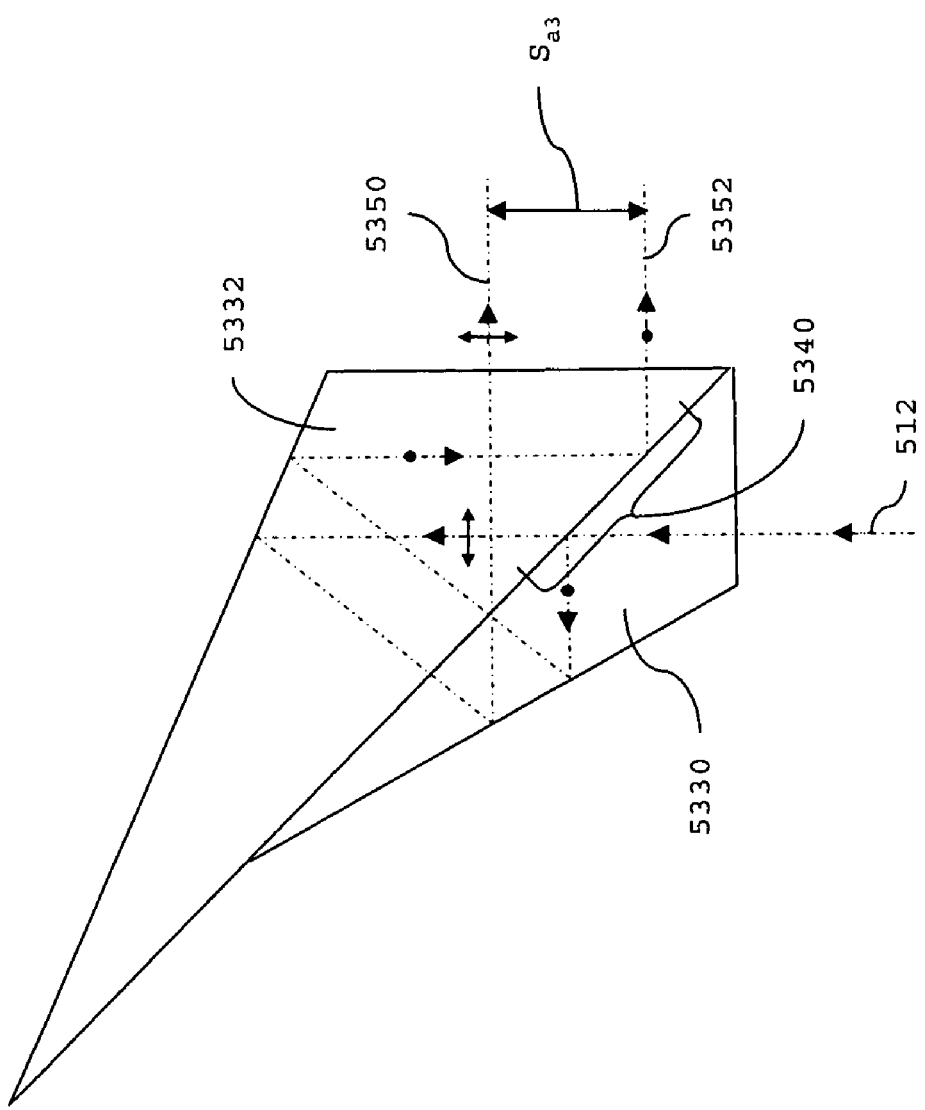
FIG. 8 is a schematic diagram of an embodiment of a beam shearing assembly.

Another embodiment of a beam-shearing assembly is shown diagrammatically in FIG. 8 and includes two prisms 5330 and 5332 and polarization beam-splitter interface 5340. A first component of input beam 512 is transmitted twice by polarization beam-splitter interface 5340 and reflected by facets of prisms 5330 and 5332 to form output beam 5350. A second component of input beam 512 is reflected twice by polarization beam-splitter interface 5340 and reflected by facets of prisms 5330 and 5332 to form beams 5350 and 5352.

The two prisms 5330 and 5332 and polarization beam-splitter interface 5340 exhibit properties the same as a Penta prism with respect to relationship of the direction of propagation of beam 512 and the directions of propagation for beams 5350 and 5352. Prisms 5330 and 5332 are preferably isomorphic with relative sizes selected to introduce a beam shear $S_{\alpha 3}$ between beams 5350 and 5352. The optical paths in refractive media are substantially the same for beam 5350 and 5352. The remaining descriptions of beams 5350 and 5352 are the same as the corresponding portion of the descriptions given for beams 550 and 552 of the first embodiment with shear $S_{\alpha 1}$ replaced by shear $S_{\alpha 3}$.

Details of additional angular displacement interferometers are disclosed in PCT Publication WO 00/66969 by Henry A. Hill and published Nov. 9, 2000, the contents of which is incorporated herein by reference, and in U.S. patent application Ser. No. 10/272,034 by Henry A. Hill, filed Oct. 15, 2002 and entitled "INTERFEROMETER FOR MEASURING CHANGES IN OPTICAL BEAM DIRECTIONS."

Referring again to FIG. 2 and FIG. 3, deviations $\theta_{z1}$, $\theta_{z2}$, $\theta_{y1}$, $\theta_{y2}$, $\beta_z$, $\beta_y$, $\delta_z$, and $\delta_y$ depend on HSPMI 111 and measurement object 190. Due to the inhomogeneous nature of the defects giving rise to beam path deviations, deviations $\theta_{z1}$, $\theta_{z2}$, $\theta_{y1}$, $\theta_{y2}$, $\beta_z$, $\beta_y$, $\delta_z$ and $\delta_y$ can vary for different nominal paths. Moreover, deviations $\theta_{z1}$, $\theta_{z2}$, $\theta_{y1}$, $\theta_{y2}$, $\beta_z$, $\beta_y$, $\delta_z$ and $\delta_y$ can vary as a function of the propagation direction of the input beam. Accordingly, deviations $\theta_{z1}$, $\theta_{z2}$, $\theta_{y1}$, $\theta_{y2}$, $\beta_z$, $\beta_y$, $\delta_z$, and $\delta_y$ can be parameterized as a function of measurement object displacement relative to the interferometer, the angular orientation of the measurement object, and the input beam propagation direction.

In applications where these deviations typically change slowly with time, such as, for example, in many precision metrology applications, deviations can be determined prior to deployment of the interferometer in its end use application. This data can be stored in a representation, such as a lookup table, which is accessed when the interference phase data captured using system 100 is to be analyzed. In some embodiments, the representation relating the observable parameters to beam deviations can be in the form of a functional representation (e.g., one or more algebraic functions), and the beam deviations can be determined from the parameters using the functions.

In certain embodiments, measurement object displacement can be determined using an iterative process. Where the correction data is parameterized by interferometrically determined parameters (e.g., measurement object displacement and/or angular orientation), the system can iterate the parameter and deviation term determination until the system converges on a value for the parameter. For example, where the deviation data is parameterized by measurement object displacement, the system can make an initial determination for the displacement from the measured phase using Equation (2). Using the initial displacement value, the system then determines the deviation terms from the representation. Using this data, the system recalculates the displacement using Equation (15) to provide a once-corrected displacement value. The system iterates this procedure by re-determining the deviation terms based on the once-corrected displacement value. This process can be repeated until the corrected displacement suitably converges.

Data relating the observable parameters to deviation angles can be characterized in a calibration procedure prior to installing the interferometer and other components in their end-use application such as described in U.S. application Ser. No. 10/366,587 entitled "APPARATUS AND METHOD FOR QUANTIFYING AND COMPENSATING NON-CYCLIC NON-LINEARITY IN INTERFEROMETRY SYSTEMS" to Henry A. Hill, the contents of which are herein incorporated in their entirety by reference. In some embodiments, deviations $\beta_z$, $\beta_y$, $\delta_z$, and $\delta_y$ can be measured by splitting off a portion of the appropriate beam with a non-polarizing beam splitter, and monitoring the beam direction while scanning the measurement object displacement, orientation angle, and/or direction of the input beam. For example, in order to determine $\beta_z$ or $\beta_y$ a beam-splitter can be positioned in both the first pass and second pass path of the measurement beam to the measurement object. The measurement beam direction is then tracked for each pass by monitoring the direction of the beam directed out of the measurement beam path by the beam-splitter while the system scans the measurement object displacement, orientation angle, and/or input beam direction of the interferometer.

Non-zero values for the deviations $\theta_{z1}$, $\theta_{z2}$, $\theta_{y1}$, $\theta_{y2}$, $\beta_z$, $\beta_y$, $\delta_z$, and $\delta_y$ can arise from imperfections in the interferometer and/or plane mirror measurement object. For example, non-zero values of $\theta_{z1}$, $\theta_{z2}$, $\theta_{y1}$, and/or $\theta_{y2}$ may be caused by surface imperfections of the plane mirror measurement object, and can cause a deviation of the first and/or second pass measurement beam from the nominal path. Additionally, imperfections in the optical components making up the interferometer can contribute to $\beta_z$ and/or $\beta_y$, either prior to the measurement beam's first pass to the measurement object or between the beam's first and second pass the measurement object.

In certain embodiments, local surface imperfections of a plane mirror measurement object can be measured by monitoring the beam direction of a beam reflected from the plane mirror measurement object. Notably such techniques can provide the local slope information of the plane mirror measurement object with resolution on the order of the diameter of the reflected beam. Beam directions can be monitored interferometrically or non-interferometrically. Examples of suitable interferometers for monitoring beam directions include angle interferometers, such as the angle interferometer described above, and Hartmann-Shack interferometers.

A Hartmann-Shack interferometer utilizes a lenslet array, which is placed in the path of a pair of overlapping beams to be measured. A detector is positioned at the focal plane of the lenslet array. When the beams are coincident and their paths are parallel to the optical axes of the lenslets, the beams are focused to an array of spots also coincident with the lenslet optical axes. However, deviations of one of the beam's direction cause it to be focused to a different location from those corresponding to the undeviated beam. The detector can track these deviations, and the data can be used to calculate the beam propagation direction based on the properties and location of the lenslet array. Use of Hartmann-Shack interferometers (also termed Hartmann-Shack sensors) in other applications is disclosed, for example, by Liang, J and co-workers in "Objective measurement of wave aberrations of the human eye with the use of a Hartmann-Shack wave-front sensor," J. Opt. Soc. Am. (A), 11, 1949-57 (1994), by J. Liang and D. R. Williams in "Aberrations and retinal image quality of the normal human eye," J. Opt. Soc. Am. (A), 14, 2873-83 (1997), and P. M. Prieto and co-workers in "Analysis of the performance of the Hartmann-Shack sensor in the human eye," J. Opt. Soc. Am. (A), 17, 1388-98 (2000).

Non-interferometric methods of monitoring beam direction include, for example, tracking the beam direction using a pixilated detector array (e.g., a CCD or CMOS camera). As the beam direction changes, it impinges on different detector elements in the array. By tracking the location of the beam on the array while scanning measurement object displacement, orientation angle, and input beam direction, the system can determine variations of the beam direction as a function of the scanned parameters. When using a pixilated detector array, the optical path of the tracked beam to the detector array should be sufficiently long to provide sufficient angular resolution.

While the aforementioned deviations can be monitored directly using techniques disclosed herein, imperfections in components of the interferometry system (including surface imperfections of the plane mirror measurement object) can also be characterized in other ways. For example, imperfections in the reflecting surface of the plane mirror measurement object (e.g., variations in the mirror's surface topography) can be accounted for by measuring the mirror's figure, which is a measure of a mirror's surface topography. The figure of each measurement object can be characterized, for example, using a Fizeau interferometer. The figure of the portions of the measurement objects may also be determined by techniques such as described in cited commonly owned U.S. patent application Ser. No. 09/853,114 entitled "IN-SITU STAGE MIRROR CHARACTERIZATION," filed May 10, 2001, U.S. patent application Ser. No. 10/217,531, also entitled "IN-SITU MIRROR CHARACTERIZATION," filed on Aug. 13, 2002, International Patent Application No. PCT/US02/25652 entitled "IN-SITU STAGE MIRROR CHARACTERIZATION" and U.S. patent application Ser. No. 10/406,749, entitled "METHOD AND APPARATUS FOR STAGE MIRROR MAPPING," filed Apr. 3, 2003, which claims priority to Provisional Patent Application 60/371,172 filed on Apr. 9, 2002, with the same title. These applications name Henry Allen Hill as inventor, and the entire contents of each is hereby incorporated by reference.

In embodiments where imperfections in optical components are measured directly, the beam path deviations can be determined from the imperfections using known relationships between the imperfections and beam paths. For example, ray tracing tools can be used to provide beam anticipated beam paths through an interferometer based on, e.g., empirical data related to optical surfaces and bulk imperfections in system components.

During error calibration and/or during use of system 100, $\theta_z$ and $\theta_y$ can be monitored interferometrically or by other methods. Interferometric methods for monitoring an orientation angle of a plane mirror measurement object are well established in the art. One way to interferometrically monitor the angular orientation of a plane mirror measurement object is to use two displacement measuring interferometers (e.g., two HSPMIs). Where the distance between the interferometer measurement axes is known, the interferometers can be used to provide the measurement object orientation within a first plane defined by the measurement axes. Angular orientation of the measurement object in a plane perpendicular to the first plane can be determined by using a third displacement measuring interferometer, wherein the third displacement measuring interferometer is positioned so that its measurement axis and the measurement axis of one of the other interferometers define a plane perpendicular to the first plane. Such multi-axis measurements may be performed using multiple discrete interferometers, such as multiple HSPMIs, or using a multiple axis metrology system that monitors the location of a measurement object in multiple degrees of freedom. Examples of multiple axis metrology systems are disclosed in U.S. Pat. No. 6,313,918, entitled "SINGLE-PASS AND MULTI-PASS INTERFEROMETRY SYSTEMS HAVING A DYNAMIC BEAM-STEERING ASSEMBLY FOR MEASURING DISTANCE, ANGLE, AND DISPERSION," in U.S. patent application Ser. No. 10/352,616, filed Jan. 28, 2003 and entitled "MULTIPLE-PASS INTERFEROMETRY," and in U.S. patent application Ser. No. 10/351,707, filed Jan. 27, 2003 and entitled "MULTIPLE DEGREE OF FREEDOM INTERFEROMETER," all by Henry A. Hill.

Although the foregoing techniques for reducing errors in interferometer 110 are described in detail with respect to an HSPMI, the techniques may be applied to other types of interferometer. In general, one can determine a relationship corresponding to Equation (12) based on the geometric configuration of the interferometer, and the system can subsequently determine the angular orientation (or other degree of freedom) of the measurement object from interferometric phase measurements based on the relationship.

Examples of other forms of interferometers that may utilize the error correction techniques disclosed herein include both single and multiple pass interferometers (the HSPMI is an example of a double pass interferometer), and include passive interferometers, dynamic interferometers, and dispersion interferometers. Alternatively, or additionally, the error correction techniques can be applied to interferometers that monitor more than one degree of freedom, interferometers that monitor variations in angular orientation of a measurement object, and angular displacement interferometers that measure beam propagation direction.

Figure 9:
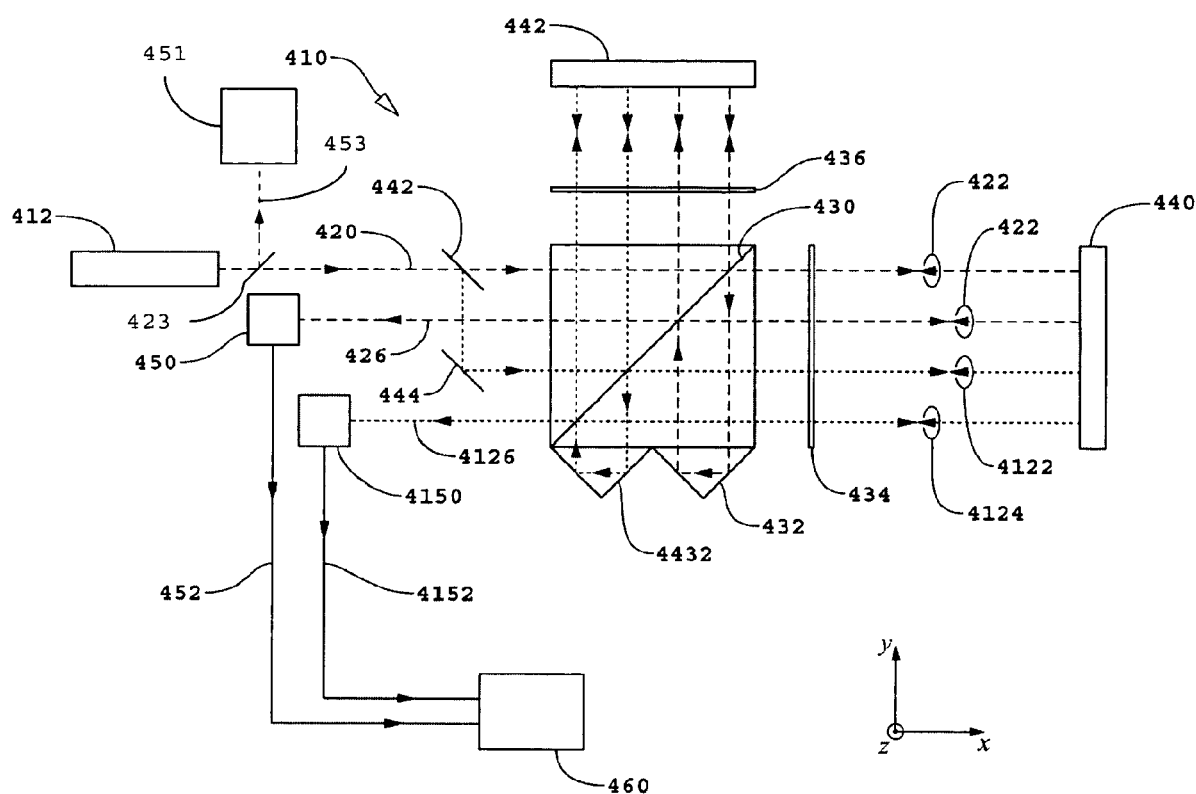
FIG. 9 is a schematic diagram of an embodiment of a multiple degree of freedom interferometer.

An example of a multiple degree of freedom interferometer is shown in FIG. 9, which shows an interferometry system 400 that includes interferometer 410, which measures two degrees of freedom of a measurement object 440. Interferometer 410 includes a compound optical assembly that corresponds to two HSPMIs. In addition to interferometer 410, interferometry system 400 further includes a source 412, detectors 450 and 4150, an angle interferometer subsystem 451, and an electronic processor 460. One HSPMI includes polarization a beam-splitter 430, a retroreflector 432, quarter wave phase retardation plates 434 and 436, and generates first and second pass measurement beams 422 and 424, respectively, and an output beam 426. The second HSPMI includes polarization beam-splitter 430, a retroreflector 4132, quarter wave phase retardation plates 434 and 436, and generates first and second pass measurement beams 4122 and 4124, respectively, and output beam 4126.

Input beam 420 is furnished by source 412. A first non-polarizing beam splitter 423 directs a portion 453 of the beam exiting source 412 to angle interferometer 451, which monitors variations in the direction of input beam 420 by monitoring the direction of beam 453. Another non-polarizing beam-splitter 442 splits beam 420 into two beams that correspond to the input beam for each HSPMI. A mirror 444 directs the redirected portion of beam 420 back towards interferometer 410. An electrical interference signal 452 is generated by the detection of output beam 426 in detector 450. Detector 450 comprises a polarizer to mix the reference and measurement beam components of output beam 426 with respect to polarization. Electrical interference signal 452 contains a heterodyne signal having a heterodyne phase $\Phi_1$. A second electrical interference signal 4152 is generated by the detection of output beam 4126 in detector 4150. Detector 4150 comprises a polarizer to mix the reference and measurement beam components of output beam 4126 with respect to polarization. Electrical interference signal 4152 contains a heterodyne signal having a heterodyne phase $\Phi_2$.

Heterodyne phases $\Phi_1$ and $\Phi_2$ can each be represented by equations corresponding to Equations (4), (5), (6), and (11). Accordingly, the optical path difference for corresponding to each phase can be determined as in the foregoing description. These optical path differences are directly related to the displacement of the measurement object with respect to the interferometer at two different locations on the measurement object surface. These locations correspond to the midpoints of where beams 422 and 424 and beams 4122 and 4124 contact the surface, respectively.

The two displacement measurements can be used to determine the angular orientation of the measurement object when the distance between the locations where the displacements are measured is known. Because the system accounts for contributions to the optical path difference caused by beam path deviations in the two displacement measurements, the system also accounts for these deviations in the angular orientation measurement.

In general, the scale factors, $\zeta$, will not be the same and the measurement axes of the two interferometers corresponding to measurement beams 422 and 424 and to measurement beams 4122 and 4124 will, in general, not be parallel. The different directions for the respective measurement axes are represented by two different sets of $\eta_z$, and $\eta_y$, for the two interferometers. The different directions for the respective measurement axes can generate systematic errors in a computed change in orientation of measurement object 440 where the computed change is based on observed differences in the displacements of measurement object 440 uncompensated for the lack of parallelism of the respective measurement axes and an assumed constant spacing of the respective measurement axes.

In general, one or more different approaches may be adopted to compensate measurements for the lack of parallelism of respective measurement axes. In some embodiments, for example, rather than compensate the displacement measurements for the effects of lack of measurement axis parallelism, one can use a parameter, d, as a spacing between the measurement axes, where d is not a constant but depends, for example, on measurement path length L. The functional dependence between d and, for example, L, can be measured by techniques such as described in cited U.S. patent application Ser. No. 10/366,587 and/or by the use of Equations (4), (5), and (6) or (11). In certain embodiments, the measurement axes can be assumed to be parallel (i.e., wherein d is a constant) and the measured displacements are individually compensated for the effects finite values for corresponding sets of $\eta_z$ and $\eta_y$.

An advantage of the compensation aspects of the present invention is that tolerances on optical components of the interferometer that affect, for example, values of $\beta_z$ and $\beta_y$, can be relaxed leading to lower manufacturing costs.

The accuracy specifications on d, $\eta_z$, $\eta_y$, and $\zeta$ that are generated in certain end use applications can be high. Consider an example where the required accuracy of a linear displacement measurement is 0.1 nm, the value of the measurement path L=0.7 m, d=40 mm, $\xi$=1.1, and $\theta_z$=0.5 milliradian. Further assume that the accuracy $\epsilon_\theta$ required for $\theta$ is $$\varepsilon_\theta \leq \frac{(0.1 \text{ nm})}{(40 \text{ nm})} \leq 2.5 \text{ nanoradian.} \qquad (26)$$

The correspond accuracy $\epsilon_d$ required for d is $$\epsilon_d \leq 0.2 \text{ micron.} \qquad (27)$$

The corresponding accuracy $\epsilon_\eta$ required for $\eta = (\eta_z^2 + \eta_y^2)^{1/2}$ is $$\epsilon_\eta \leq 0.13 \text{ microradian.} \qquad (28)$$

The accuracy specifications on d, $\eta_z$, $\eta_y$, and $\zeta$ may become even higher when the interferometer system is used in conjunction with an off-axis alignment scope. The effects of errors in such parameters are generally amplified by the ratio of the displacement of the off-axis alignment scope from the measurement axes of the interferometer system and d. A typical value for the ratio is 4. In some embodiments, interferometer 410 can be used to provide measurements of the angular orientation of the measurement object used to look-up the appropriate beam deviation data and determine the displacement of the measurement object with respect to the interferometer. In other words, such angular orientation measurements can be used to determine $\theta_z$ and $\theta_y$ and to determine appropriate values for $\zeta$, $\eta_z$, and $\eta_y$ in Equation (15).

In the foregoing embodiments, the optical path difference between the measurement and reference beams is directly related to the displacement of the measurement object relative to the interferometer. However, in other embodiments, the error correction techniques described herein can be applied to interferometers in which the optical path difference is directly related to other degrees of freedom of the interferometry system. For example, in some embodiments, the optical path difference can be directly related to the angular orientation of the measurement object. Such embodiments include interferometers where instead of only the measurement beam (not the reference beam) contacting the measurement object, both beams are directed to contact the measurement object but at difference locations. In such a configuration, the phase is directly related to an angular orientation of the measurement object in the plane defined by the two beam paths. Examples of such interferometers are described aforementioned U.S. patent application Ser. No. 10/351,708, entitled "MULTI-AXIS INTERFEROMETER," filed Jan. 27, 2003, by Henry A. Hill.

In some embodiments, the error correction techniques described above can be applied to interferometry systems that include a dynamic element which adjusts the direction of one or more beams in the interferometry system during operation of the interferometry system. Such interferometry systems are sometimes referred to as dynamic interferometry systems and examples of such systems are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill, the entire contents of which is hereby incorporated by reference.

In embodiments of dynamic interferometry systems, interferometers can be configured to maintain a measurement beam substantially orthogonal to a plane measurement mirror and to minimize the lateral beam shear between the measurement and reference beam components of the output beam to a detector. These interferometers use a dynamic beam steering element to redirect the input beam in response to changes in the orientation of the measurement plane mirror and/or changes in the direction of the input beam.

Figure 10:
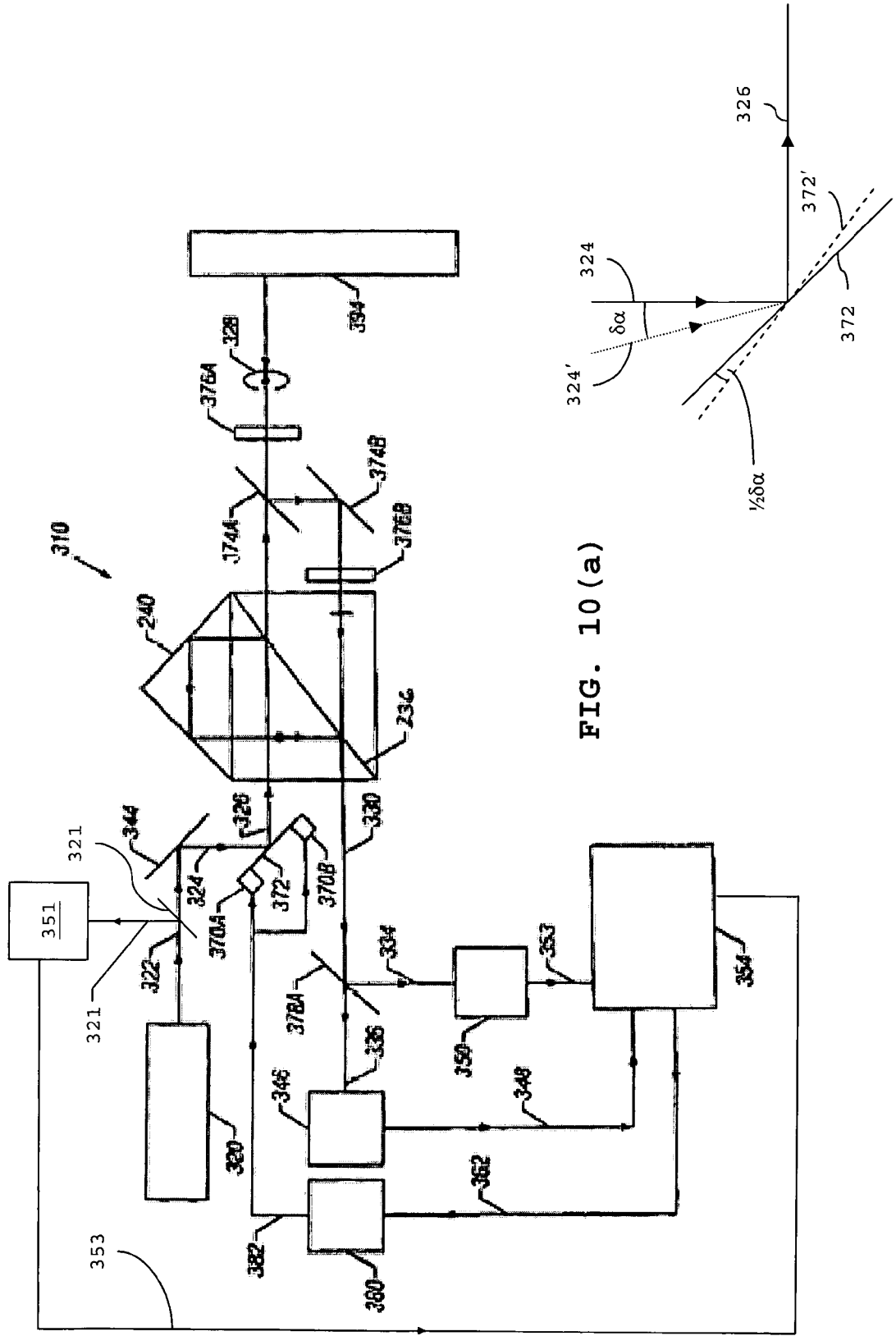
FIG. 10(a) is an embodiment of an interferometry system that includes a dynamic beam steering element.
FIG. 10(b) shows a portion of the interferometry system shown in FIG. 10(a).

FIG. 10(a) depicts in schematic form an interferometry system 1000 for measuring and monitoring changes in displacement of a plane mirror measurement object 394 wherein the propagation direction of a measurement beam of an interferometry system is substantially orthogonal to the plane mirror and there is substantially no beam shear at the interferometer system. The orientation of the measurement object may vary during operation of the system. Interferometry system 1000 includes a (heterodyne or homodyne) single-pass interferometer with a dynamic beam-steering element generally depicted in FIG. 10(a) at 310, a differential angle displacement interferometer 350, and an angle interferometer subsystem 351.

Interferometry system 1000 measures a displacement of measurement object mirror 394 wherein the propagation direction of measurement beam 328 is orthogonal to the reflecting surface of mirror 394 independent of changes in orientation of mirror 394 in the plane of FIG. 10(a). In addition, there are substantially no shears of reference and measurement beams in single pass interferometer 310 and in differential angle displacement interferometer 350. In addition, the shear of measurement beam 328 at mirror 394 is about one quarter of the shear of the second pass measurement beam of a double pass plane mirror interferometer at the plane mirror measuring object for equivalent conditions with respect to a change in orientation of measuring object and to distance between the interferometers and the measuring object.

Source 320 can be any of a variety of frequency modulation apparatus and/or lasers, such as those described above in connection with interferometry system 100. Source 320 directs and input beam along an input beam path 322. A non-polarizing beam splitter directs a portion of the input beam along a path 321 to an angle interferometer subsystem 351, which monitors variations in the direction of the input beam. A mirror 344 directs the input beam along path 324. The input beam is incident on interferometer 310 that includes a dynamic beam steering element 372 and is reflected by dynamic beam steering element 372 along path 326. The measurement beam component of the input beam is transmitted sequentially by polarizing interface 236, polarizing beam-splitter 374A, and quarter-wave phase retardation plate 376A and exits the interferometer along path 328. The measurement beam returns to the interferometer along path 328 exits interferometer 310 as a measurement beam component of output beam along output beam path 330 after being transmitted by elements comprising quarter-wave phase retardation plate 376A, half-wave phase retardation plate 376B, and polarizing interface 236 and after being reflected by polarizing beam-splitter 374A and mirror 374B. Quarter-wave phase retardation plate 376A is oriented to rotate the plane of polarization of a measurement beam by 90 degrees following a double pass through phase retardation plate 376A. Half-wave phase retardation plate 376B is oriented to rotate the plane of polarization of a measurement beam by 90 degrees following a single pass through phase retardation plate 376B.

The reference beam component of the input beam is reflected twice by polarizing interface 236 and once by retroreflector 240 and exits the interferometer as a reference beam component of the output beam along path 330.

A first portion of the output beam is reflected by beam-splitter 378A as a first output beam along path 334. A second portion of the output beam is transmitted by beam-splitter 378A as a second output beam propagating along path 336. The first output beam is incident on differential angle displacement interferometer 350 and the second output beam is incident on detector 346.

Analyzer 378A comprises a polarizing beam-splitter oriented so as to mix the reference beam and measurement beam components of the first and second output beams. Beam path 334 is actually at a nominal angle of 45 degrees to the plane of FIG. 10(a). However, for simplifying the diagrammatic representation of the first embodiment in FIG. 10(a) without compromising the description of various features, the orientation of analyzer 378A is shown in FIG. 10(a) as reflecting the first output beam in the plane of FIG. 10(a).

Interferometer 310 introduces phase shift $\phi_1$ between the measurement and reference beam components of the output beam so that the output beam is a phase-shifted beam. The same phase shift $\phi_1$ is introduced between the measurement and reference beam components of the first and second output beams. The magnitude of phase shift $\phi_1$ is related to difference in round-trip physical length $2L_1$ of the measurement path and reference paths according to the formula $$\phi_1 = 2k_1 L_1 n_1 \qquad (29)$$

where $n_1$ is the average of the refractive index of a gas in the measurement path.

The first output beam propagating along path 334 is incident on differential angle displacement interferometer 350. Differential angle displacement interferometer 350 is a differential angle displacement interferometer used to introduce a relative phase shift $\phi_2$ between the measurement and reference beam components of the first output beam. Relative phase shift $\phi_2$ is related to the difference in the directions of propagation $\beta$ of the measurement and reference beam components of the output beam in a plane defined by the orientation of differential angle displacement interferometer 350. Relative phase shift $\phi_2$ is subsequently measured and used as an error signal in a servo control system that controls the orientation of dynamic beam steering element 372 such that angle $\beta$ is maintained at a value substantially equal to zero. The servo control system includes a control circuit having a signal processor that calculates the change in the angular orientation of the measurement object from the relative phase shift measured by the differential angle displacement interferometer. Although the error signal in the described embodiment is derived from a differential angle displacement interferometer, other devices can also be used to generate the error signal. For example, a quadrature detector or a CCD camera can be used to generate the error signal from the output beam.

The second output beam propagating along path 336 is a mixed beam and is detected by detector 346 to generate electrical interference signal or heterodyne signal 348. Detector 346 is preferably a quantum photon detector and heterodyne signal 348 contains as a heterodyne phase $\phi_1$. Heterodyne signal 348 is transmitted to analyzer 354. Analyzer 354 comprises a phase meter that obtains heterodyne phase $\phi_1$ using a phase meter and a reference phase from source 320. Analyzer 354 further comprises a processor that computes the change in displacement of mirror 394 using Equation (29).

Analyzer 354 comprises a processor that extracts phase ($\phi_1+\phi_2$) from heterodyne signal 353 by a phase meter using a reference phase from source 320. Analyzer 354 computes $\phi_2$ from the difference of measured phases ($\phi_1+\phi_2$) and $\phi_1$. Analyzer 354 next computes the difference in angle β from the computed phase $\phi_2$. Measured angle difference β is transmitted to servo controller 380 as signal 362 to generate servo control signal 382. Servo control signal 382 is transmitted to transducers 370A and 370B that control the orientation of dynamic beam steering element 372 in the plane of FIG. 10(a). The effect of the servo control of dynamic beam steering element 372 is to servo the orientation of element 372 to maintain $$\beta_{1S}=0 \qquad (30)$$

as the orientation of object mirror 394 changes and the direction of the measurement beam changes accordingly. When the condition β=0 is met, beam path 328 is normal to the reflecting surface of object mirror 394.

One can determine a relationship corresponding to Equation (12) based on the geometric configuration of the interferometer, and the system can subsequently determine the position of the measurement object along the interferometer axis (or other degree of freedom) from interferometric phase measurements based on the relationship. Variations in the direction of the input beam, for example, are monitored by angle interferometer 351. Angle interferometer 351 transmits information 353 about the input beam direction to analyzer 354, which uses the information when determining the measurement object position from the interferometric phase monitored by interferometer 310.

Alternatively, or additionally, in some embodiments, the system can adjust the orientation of beam steering element 372 in response to variations in the input beam direction. Referring to FIG. 10(b), in response to a variation, δα, in the input beam direction (shown in FIG. 10(b) as a deviation of the input beam path from path 324 to path 324'), the system adjusts the orientation of the beam steering element by δα/2 from 372 to 372' in order to maintain the input beam direction along (or parallel to) path 326.

The techniques described above can also be implemented in interferometry systems that use other mechanisms to reduce beam shear. For example, the techniques can be implemented in interferometry systems that passively (as opposed to dynamically as in interferometry system 1000) condition the input beam in order to reduce beam shear associated with orientation changes in the measurement object. Conditioning the input beam refers to adjusting the relative direction of propagation and/or location of the beam relative to a reference beam path to compensate for changes in the beam's path in the interferometer that are introduced by changes in the measurement object position. Conditioning of the input beam is achieved passively. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill, the entire contents of which are hereby incorporated by reference.

Embodiments of the interferometry systems that passively condition the input beam typically include a beam conditioning section between a light source and an interferometer that conditions properties of an input beam forming a conditioned input beam, which is then directed to the interferometer. The beam conditioning section includes components that compensate for changes in the propagation of the measurement beam that would be caused by changes in the orientation of the measurement object. The beam conditioning section can also include components that compensate for absolute beam shear that may be introduced during the beam conditioning to minimize absolute shear of the conditioned input beam at the interferometer.

Other beams can be derived from the conditioned input beam prior to the interferometer. For example, a portion of the conditioned input beam can be directed to a reference detector for determining a reference phase. Alternatively, or additionally, a portion of the conditioned input beam can be directed to an angle interferometer. Angle interferometers can be used to monitor changes in the direction of propagation of the conditioned input beam relative to an optical axis defined by the beam conditioning portion.

For embodiments in which the measurement object is a plane mirror, conditioning the input beam causes the measurement beam to have a direction of propagation that is substantially orthogonal to the reflecting surface of the plane mirror for a range of orientation angles. As the orientation of the measurement object varies within this range of angles, beam conditioning ensures that the measurement beam retains normal incidence at the measurement object. Accordingly, shear between the reference and measurement components both within the interferometer and in the output beam that could result from such changes in measurement object orientation is reduced.

In addition, the reference and measurement beam components of the conditioned input beam have substantially zero shears at the input of one or more interferometers used to measure changes in the position of the measurement object. In other words, the absolute beam shear of the conditioned input beam entering the interferometer can be substantially zero despite changes in the orientation/position of the measurement object.

The measurement object can be used as an integral part of the apparatus in conditioning the input beam to form the conditioned input beam. The input beam is typically directed to contact the measurement object at least once in the conditioning portion of the apparatus. In heterodyne interferometry, both components of the input beam are directed to contact measurement object. Accordingly, any change in the position of the measurement object from a reference position causes a change in the propagation direction/beam location relative a path defined by the reference position.

Figure 11:
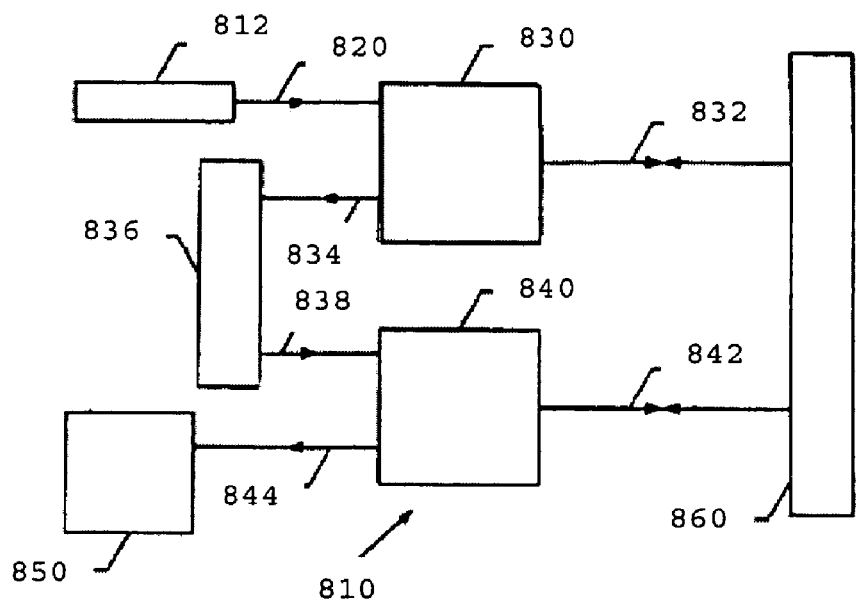
FIG. 11 is a schematic diagram of an interferometry system that includes a beam conditioning system.

An interferometry system 810 that includes a beam conditioning portion is shown schematically in FIG. 11. Interferometry system 810 includes a source 812; a beam conditioner 830; an optical relay system 836; interferometer 840, detector 850, and measurement object mirror 860. Source 812 includes a laser for providing one or more beams 820 to interferometer system 810.

Interferometer 840 can be any type of interferometer, e.g., a differential plane mirror interferometer, a double-pass interferometer, a single pass plane mirror interferometer or a Michelson-type interferometer. Interferometer 840 can be designed to monitor, for example, changes in optical path length, changes physical path length, changes in refractive index, changes in wavelength of a beam, or intrinsic gas properties along a path length. Interferometer 840 directs one or more reference beams along corresponding reference paths (which may contact corresponding reference objects) and a corresponding measurement beams along corresponding measurement paths contacting a measurement object at one or more spots (e.g., an extended mirror on a lithography stage), and then combines the corresponding reference and measurement beams to form output beams 844. The output beam contains information about the relative difference in optical path length between the corresponding reference and measurement paths. When the reference and measurement beams have orthogonal polarizations, the intensity of at least one intermediate polarization of the overlapping pair of exit beams is selected to produce the optical interference. For example, a polarizer can be positioned within interferometer 840 to mix the polarizations of the overlapping pair of exit beams, which is then sent to detector 850 as a mixed beam 844. Alternatively, the polarizer can be positioned within detector 850. Detector 850 measures the intensity of the selected polarizations of the overlapping pairs of exit beams to produce the interference signals. Portions of the beams can be combined with one another before being directed along the reference and measurement paths to provide a reference pair of overlapping exit beams, which is used to provide a reference interference signal.

Figure 12B:
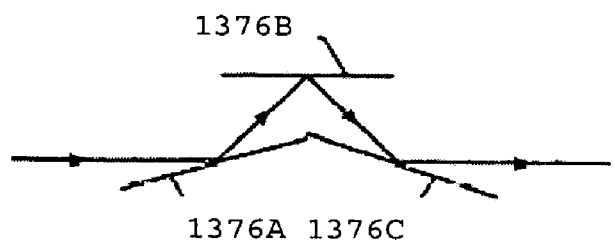
FIG. 12(b) is an embodiment of an afocal system.
Figure 12C:
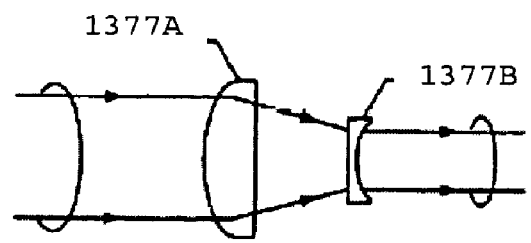
FIG. 12(c) is another embodiment of an afocal system.
Figure 12A:
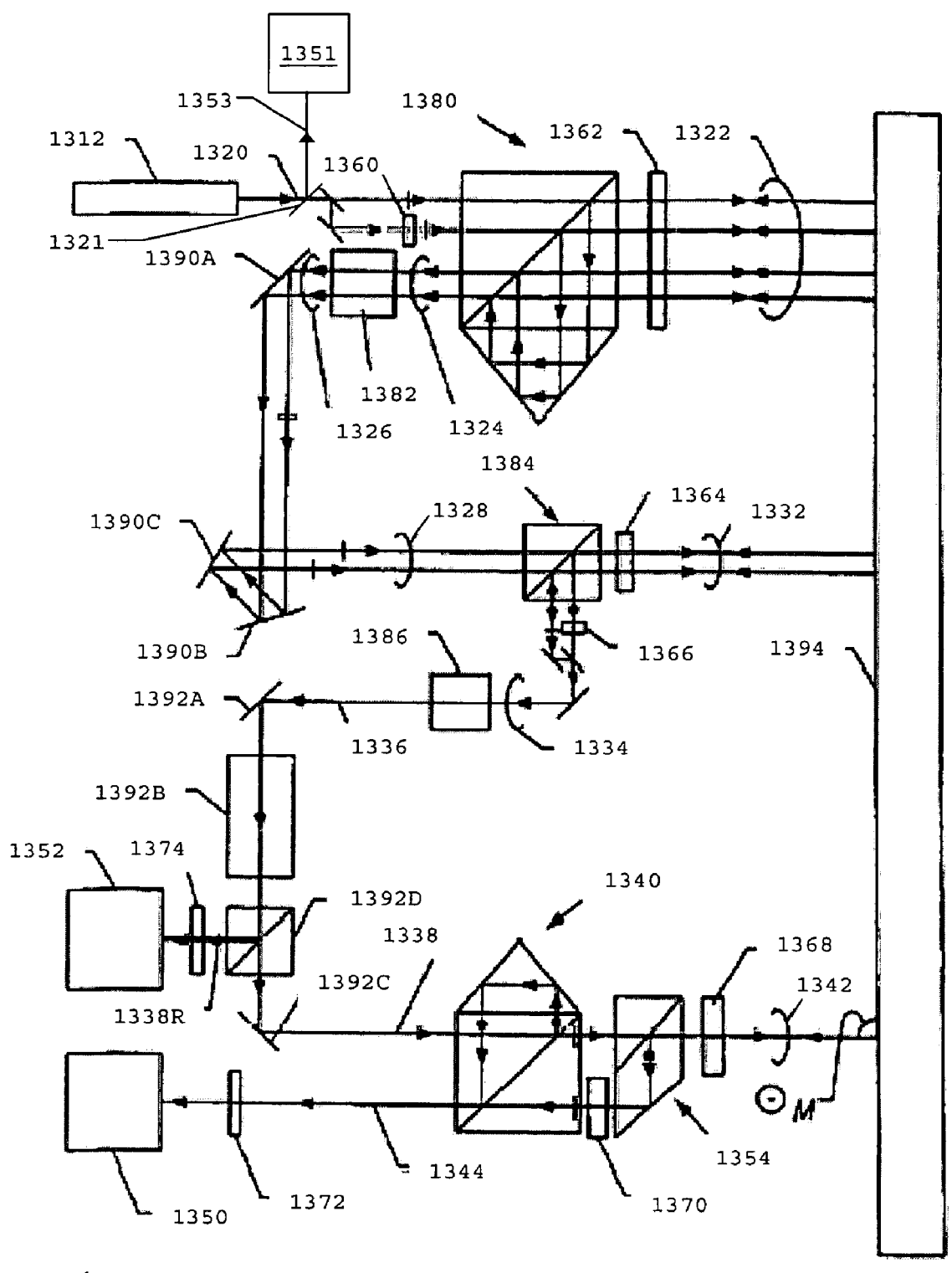
FIG. 12(a) is an embodiment of an interferometry system including a beam conditioning system.

A specific embodiment of an interferometry system that includes a beam conditioning portion is shown diagrammatically in FIG. 12(*a*). Interferometry system 1300 includes a differential plane mirror interferometer shown generally at 1380 wherein plane mirror 1394 serves as both the reference and measuring objects. Interferometry system 1300 further includes a single pass plane mirror interferometer generally shown at 1384 wherein the reference and measurement objects are also plane mirror 1394. The remaining components of the interferometry system 1300 are a source 1312, afocal systems 1382 and 1386 and beam relay system comprising elements 1390A, 1390B, and 1390C, and angle interferometer subsystem 1351.

During operation, source 1312 directs an input beam 1320 to interferometer 1380. A non-polarizing beam splitter 1321 derives a secondary beam 1353 from input beam 1320 and directs secondary beam 1353 to angle interferometer subsystem 1351 which monitors variations in the direction of the secondary beam, thereby monitoring variations in the direction of input beam 1320.

Input beam 1320 is incident on interferometer 1380 to form beam 1322 and output beam 1324. Beam 1322 comprises both reference and measurement beams that each makes a double pass to mirror 1394. Elements 1360 and 1362 are half wave and quarter wave phase retardation plates, respectively.

Output beam 1324 includes spatially separated reference and measurement output beam components. Output beam 1324 is transmitted by afocal 1382 to form demagnified beam 1326. Directions of propagation of components of output beam 1324 and demagnified beam 1326 relative to the direction of propagation of input beam 1320 are independent of any change in orientation of mirror 1394. This is a direct consequence of the double pass of both the reference and measurement beams to mirror 1394. However, there are lateral shears of the components of output beam 1324 and demagnified beam 1326 that result from a change in orientation of mirror 1394. The magnitudes $S_1$ and $S_2$ of the lateral shear vectors representing the shears of beam 1324 and beam 1326, respectively, are $$S_1 = 4\theta L$$

$$S_2 = \eta_1 4\theta L \tag{31}$$

where $\theta$ is the change in angular orientation of mirror 1394 from an orientation at which beam 1322 is normally incident on mirror 1394, $\eta_1$ is the demagnification factor describing the demagnification introduced by afocal system 1382, and L is a physical path length associated with beam 1322. The magnitude of length L is nominally the distance between the reflecting surface of mirror 1394 and the nodal point of the retroreflector in interferometer 1380 measured in a direction parallel to the direction of propagation of input beam 1320. The change in angular orientation of mirror 1394 comprises the net effect of changes in pitch and yaw. The directions of the lateral shear vectors are in the plane of FIG. 12(*a*) for a change in yaw and perpendicular to the plane of FIG. 12(*a*) for a change in pitch.

Demagnified beam 1326 is incident on beam relay system comprising elements 1390A, 1390B, and 1390C and exits as beam 1328. The reflecting properties of the beam relay system are equivalent to those of a single reflecting surface such that the direction of propagation of beam 1328 is parallel to the direction of propagation of beam 1324. In addition, the lateral shear of beam 1328 resulting from a change in orientation of mirror 1394 is the same as the corresponding lateral shear of beam 1326.

Beam 1328 is incident on a single pass interferometer generally shown at 1384 in FIG. 12(*a*). The reflecting surface of mirror 1394 serves as the reference and measurement objects for interferometer 1384. Beam 1332 comprises both reference and measurement beams that contact mirror 1394 and output beam 1334 is the output beam of interferometer 1384.

Output beam 1334 is transmitted by afocal system 1386 as magnified beam 1336. Changes in directions of propagation of components of output beam 1334 and magnified beam 1336 are $2\theta$ and $2\theta/\eta_2$, respectively, with respect to the direction of propagation of beam 1328 where $\eta_2$ is the magnification factor of afocal system 1386. For the value of $\eta_2 = 2$, the direction of propagation of magnified beam 1336 relative to a vector orthogonal to the reflecting surface of mirror 1394 is independent of any change in orientation of mirror 1394. The magnitudes of the lateral shear vectors $S_3$ and $S_4$ representing the shears of beam 1334 and beam 1336, respectively, are $$S_3 = (4\theta_1 - 2)\theta L$$

$$S_4 = \theta_2(4\theta_1 - 2)\theta L \tag{32}$$

Because of the factor $(4\theta_1 - 2)$ in Equations (32), the magnitudes of lateral shears $S_3$ and $S_4$ are zero for the demagnification factor $$\theta_1 = 0.5. \tag{33}$$

Thus for $\theta_1 = 0.5$, there are substantially no lateral shears of the components of output beam 1334 and magnified beam 1336 that result from a change in orientation of mirror 1394.

Next as shown in FIG. 12(*a*), magnified beam 1336 is incident on a second relay optical system comprising mirrors 1392A and 1392C and image inverter 1392B. Non-polarizing beam splitter 1392D does not alter the properties of the second relay optical system with respect to the relative directions of propagation of beams 1336 and 1338. The properties of the second relay optical system are the same as a polarization preserving retroreflector with regard to properties of the transmitted beam 1338 relative to properties of incident beam 1336. A polarization preserving retroreflector is the preferred form of retroreflector in order to eliminate a potential source of polarization mixing. Polarization preserving retroreflectors are described, for example, in U.S. Pat. No. 6,198,574 B1 by Henry Allen Hill entitled "POLARIZATION PRESERVING OPTICAL SYSTEMS," the contents of which are included herein in there entirety by reference. Polarization mixing generally can generate cyclic errors in changes in displacement of mirror 1394 as measured by interferometer 1340.

Image inverter 1392B inverts the wavefront of beam 1336 upon being transmitted by inverter 1392B wherein the axis of the inversion is a line in the plane of FIG. 12(*a*) and that is perpendicular to the propagation direction of the beam. Image inverter 1392B is shown schematically in FIG. 12(*b*) and comprises three mirrors 1376A, 1376B, and 1376C. Other forms of image inverters known to one skilled in the art may be used for image inverter 1392B without departing from the scope and spirit of the present invention. The plane of FIG. 12(*b*) is orthogonal to the plane of FIG. 12(*b*). The function of image inverter 1392B in the second relay system is to cause for a beam transmitted by inverter 1392B a change in beam propagation direction in the plane of FIG. 12(*b*) that is opposite to the corresponding change in beam propagation direction in the plane of FIG. 12(*b*) of the corresponding beam incident on inverter 1392B.

Beam 1338 is incident on interferometer 1340 in FIG. 12(*a*) and is transmitted as output beam 1344. Interferometer 1340 is a single pass interferometer wherein the measurement beam 1342 makes a single pass to mirror 1394. Elements 1368 and 1370 are quarter wave and half wave phase retardation plates, respectively, and element 1354 comprises a polarizing beam splitter and a rhomb. Since a change in the angle of incidence of beam 1338 on interferometer 1340 is θ, the direction of propagation of beam 1342 relative to a vector orthogonal to reflecting surface of mirror 1394 is independent of changes of orientation of mirror 1394. In addition, the direction of propagation of beam 1342 may be aligned parallel to the vector, i.e., the angle of incidence $\theta_M$ (see FIG. 12(*a*)) of beam 1342 on the reflecting surface of mirror 1394 is 90 degrees, by an adjustment of, for example, the orientations of mirrors, such as mirror 1392C, so that the direction of propagation of beam 1342 is orthogonal to the reflecting surface of mirror 1394 independent of changes of orientation of mirror 1394. Since both the beam shear of beam 1338 at interferometer 1340 is substantially zero and the direction of propagation of beam 1342 is always orthogonal to reflecting surface of mirror 1394 independent of changes of orientation of mirror 1394 for at least a range of angles, there is substantially no beam shear of output beam 1344 associated with changes in orientation of mirror 1394.

Beam shear of beams in an interferometer can generate non-cyclic non-linear errors in interferometrically measured changes in displacement of a measurement object. As a consequence of the substantially no beam shear of output beam 1344 associated with changes in orientation of mirror 1394, corresponding non-cyclic non-linear errors are substantially eliminated in displacements of mirror 1394 measured by interferometer 1340.

Output beam 1344 is next transmitted by polarizer 1372 to generate a mixed output beam and then detected by detector 1350 to produce an electrical interference signal or heterodyne signal. Detector 1350 is preferably a quantum photon detector. The phase of the heterodyne signal is subsequently determined by a phase meter (not shown in FIG. 12(*a*)) using a reference signal from source 1312 (not shown in FIG. 12(*a*)). Changes in displacement of mirror 1394 are inferred from the changes in the measured phase.

The relative phase of the reference and measurement beam components of beam 1338 can exhibit changes due for example to turbulence in non-coextensive optical paths of progenitor beam components of beam 1338 and to wavefront errors and beam shears generated by changes in orientation of mirror 1394. These changes in phase, if not compensated, may be large enough for certain end use applications to produce unacceptable errors in measured changes in the relative phase of output beam 1344. The errors that result from the changes in phase can be compensated by splitting off part of beam 1336 transmitted by image inverter 1392B as phase reference beam 1338R by non-polarizing beam splitter 1392D. Beam 1338R is next transmitted by polarizer 1374 to generate a mixed phase reference beam and then detected by detector 1352 to produce a reference electrical interference signal or reference heterodyne signal. Detector 1352 is preferably a quantum photon detector. The phase of the reference heterodyne signal is subsequently determined by a phase meter (not shown in FIG. 12(*a*)) using the reference signal from source 1312 (not shown in FIG. 12(*a*)). The measured phase of the reference heterodyne signal is used to compensate for cited errors in measured phase of the heterodyne signal associated with output beam 1344.

Afocal systems 1382 and 1386 may include afocal lenses and/or anamorphic afocal attachments [see, e.g., Chapter 2 entitled "Afocal Systems" by W. B. Wetherell in *Handbook Of Optics II*, Second Edition (McGraw-Hill)]. A first embodiment is shown diagrammatically for an afocal system such as represented by a Galilean afocal lens. However, a Keplerian afocal lens can be used. If a Keplerian afocal lens is used for one or more afocal systems, the transformation properties of corresponding relay lens systems must s be changed to reflect the inverting features of the Keplerian afocal lens. The afocal systems may also comprise anamorphic afocal attachments based on cyclindrical lenses, prisms, and birefringent elements.

An example of a Galilean afocal lens is shown diagrammatically in FIG. 12(*c*). The Galilean afocal lens includes positive and negative lenses 1377A and 1377B, respectively, and illustrates its operation in a demagnifying mode.

Interferometers 1380 and 1384 are shown diagrammatically in FIG. 12(*a*) with the beam components of beam 1322 and of beam 1332 lying in the same plane to simplify the description of the operation of interferometry system 1300. The configuration of the embodiment shown in FIG. 12(*a*) also has an advantage with respect to the minimum width required for the reflecting surface of mirror 1394 in the dimension perpendicular to the plane of FIG. 12(*a*). It will be evident to those skilled in the art that, in certain embodiments, other configurations of interferometers 1380 and 1384 may be used. For example, in some embodiments, beam components of beam 1322 and of beam 1332 may include two or more planes parallel to the plane of FIG. 12(*a*).

While specific embodiments of a variety of different types of interferometer systems are described, in general, the techniques disclosed herein may be implemented in still further embodiments of interferometer systems. For example, the techniques may be implemented in interferometry systems for measuring more than one degree of freedom and for reducing beam shear, such as those described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). The described techniques can also be implemented in dispersion interferometers. Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

The interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 13:
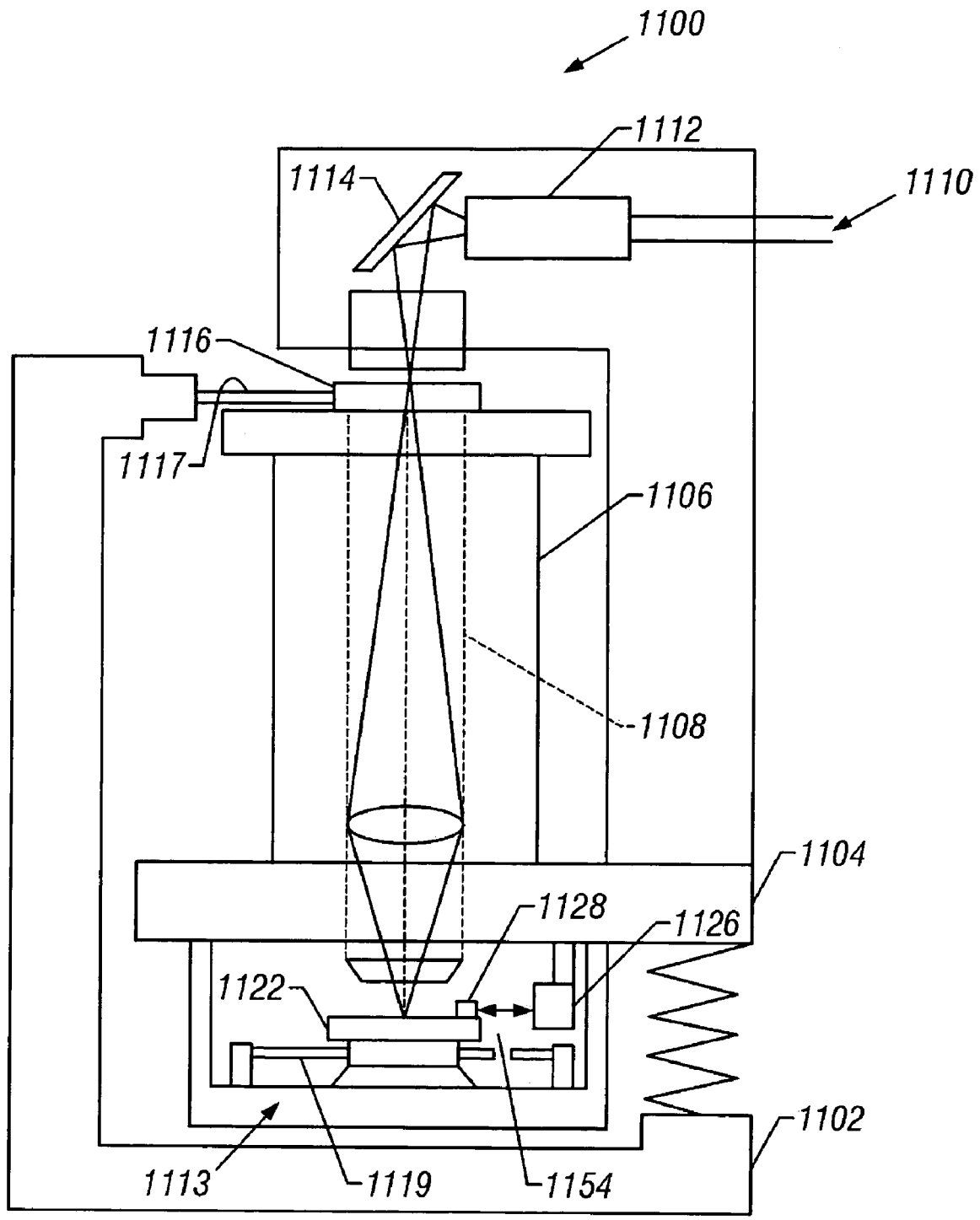
FIG. 13 is a schematic diagram of an embodiment of a lithography tool that includes an interferometer.

An example of a lithography scanner 1100 using an interferometry system 1126 is shown in FIG. 13. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 14A:
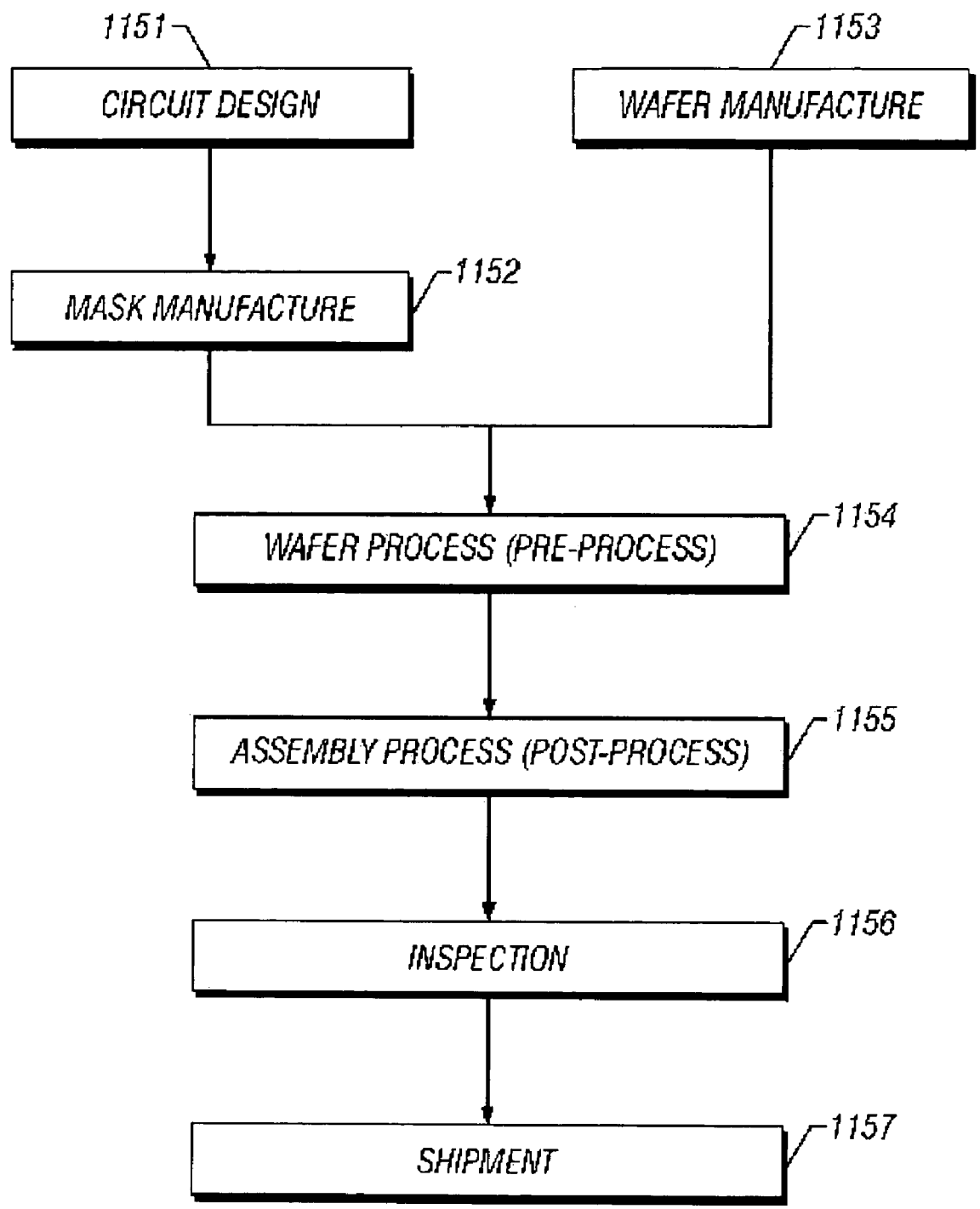
FIG. 14(a) and FIG. 14(b) are flow charts that describe steps for making integrated circuits.
Figure 14B:
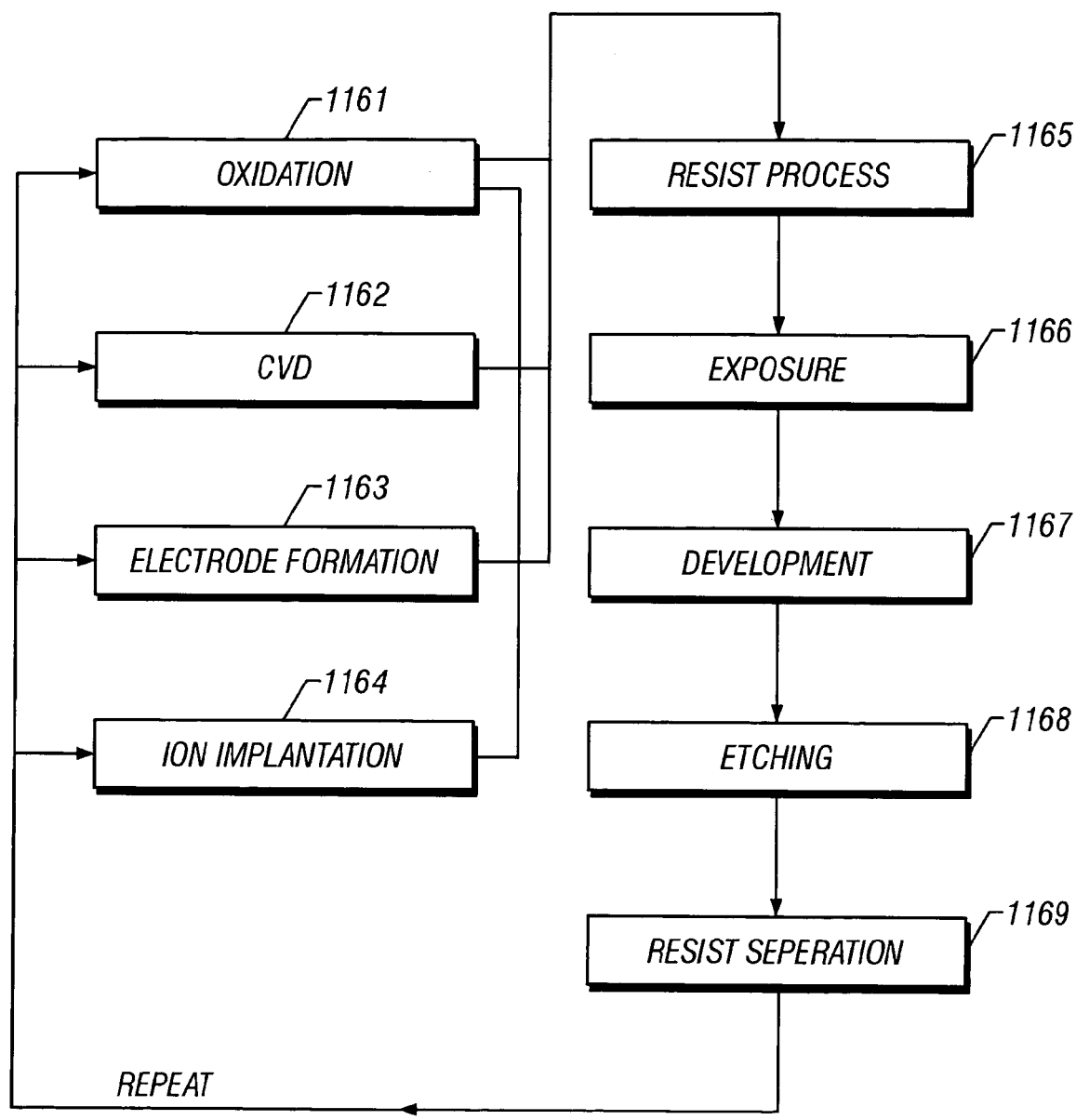

As is well known in the art, lithography is a critical part of manufacturing methods for making semiconducting devices. For example, U.S. Pat. No. 5,483,343 outlines steps for such manufacturing methods. These steps are described below with reference to FIGS. 14(*a*) and 14(*b*). FIG. 14(*a*) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process that is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 14(*b*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 15:
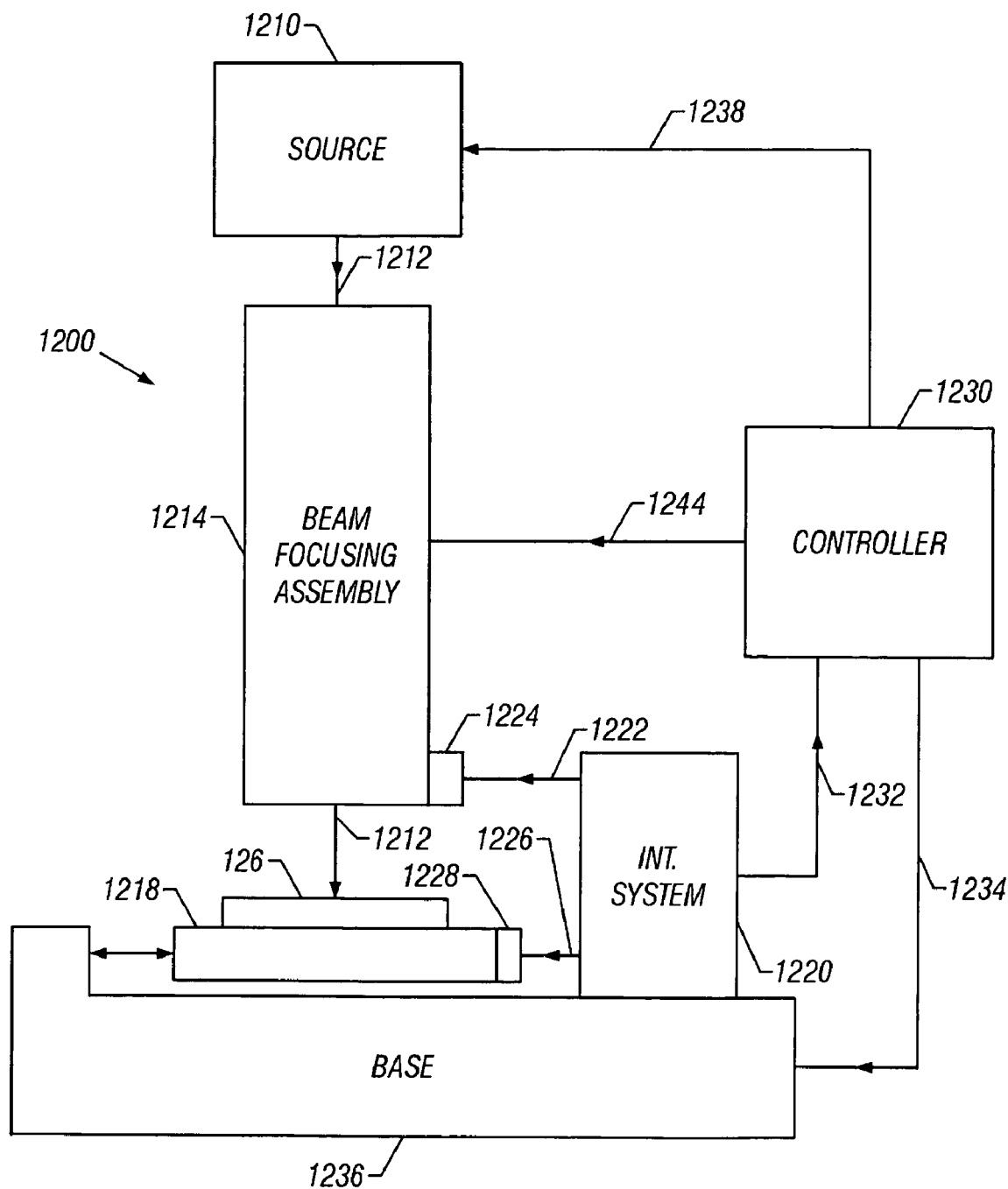
FIG. 15 is a schematic of a beam writing system that includes an interferometry system.

As an example, a schematic of a beam writing system 1200 is shown in FIG. 15. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Other embodiments are within the scope of the claims.

What is claimed is:

1. A method, comprising:
    deriving a first beam and a second beam from an input beam and directing the first and second beams along different paths, where the path of the first beam contacts a measurement object;
    producing an output beam comprising a phase related to an optical path difference between the different beam paths;
    determining a position of the measurement object with respect to at least one degree of freedom based on information derived from the output beam;
    monitoring variations in a direction of the input beam; and
    using the monitored variations in the direction of the input beam to reduce errors in the determined position associated with deviations of the path of the input beam from a nominal input beam path.

2. The method of claim 1, wherein the variations in the input beam direction are monitored using an angle interferometer.

3. The method of claim 1, wherein variations in the input beam direction are monitored in a first plane.

4. The method of claim 3, wherein variations in the input beam direction are also monitored in a second plane orthogonal to the first plane.

5. The method claim 1, wherein the errors in the determined position of the measurement object are reduced based on precalibrated information that accounts for contributions to the optical path difference caused by a deviation of the path of the input beam from the nominal input beam path.

6. The method of claim 5, wherein the precalibrated information comprises a set of correction data values and reducing the errors includes selecting one of the values from the set of correction data values based on the monitored variation.

7. The method of claim 6, wherein the precalibrated information comprises a lookup table including the set of correction data values.

8. The method of claim 5, wherein reducing the errors includes determining a correction value using the precalibrated information and the monitored variation.

9. The method of claim 8, wherein the precalibrated information comprises information describing a functional relationship between the input beam path and corrections to the position of the measurement object.

10. The method of claim 1, wherein the input beam is directed to the interferometer via a beam steering assembly.

11. The method of claim 10, wherein the errors are reduced by adjusting the beam steering assembly to reduce a deviation of the path of the input beam from the nominal input beam path based on the monitored variations.

12. The method of claim 11, wherein the beam steering assembly is adjusted using a servo controller that receives information about the monitored variations in the input beam direction.

13. The interferometry system of claim 10, wherein the measurement object comprises a plane mirror.

14. The interferometry system of claim 13, wherein the beam steering assembly causes the measurement beam to be orthogonal to the plane mirror for a range of orientations of the plane mirror.

15. The method of claim 1, further comprising directing a preconditioned input beam to reflect from the measurement object and deriving the input beam from the preconditioned input beam after it reflects from the measurement object.

16. The method of claim 15, wherein the variations in the input beam direction are monitored by monitoring variations in the direction of the preconditioned input beam.

17. A system, comprising:
    an interferometer configured to derive a first beam and a second beam from an input beam, to direct the first and second beams along different paths, where the path of the first beam contacts a measurement object, and to produce an output beam comprising a phase related to an optical path difference between the different beam paths;
    an angle interferometer configured to monitor variations in a direction of the input beam; and
    an electronic controller configured to determine a position of the measurement object with respect to at least one degree of freedom based on information derived from the output beam and to use the monitored variations in the direction of the input beam to reduce errors in the determined position associated with deviations of the path of the input beam from a nominal input beam path.

18. The system of claim 17, wherein the interferometer is a multiple pass interferometer.

19. The system of claim 17, wherein the angle interferometer comprises a beam shearing assembly configured to introduce a shear between two orthogonally polarized components of a secondary beam related to the input beam, the amount of the shear being related to a direction of the secondary beam.

20. The system of claim 17, further comprising a beam steering assembly having a beam steering element configured to direct the input beam to the interferometer and an electronic positioning system to selectively orient the beam steering element relative to the interferometer.

21. The system of claim 20, further comprising a control circuit coupled to the electronic positioning system and configured to cause the electronic positioning system to reorient the beam steering element based on information derived from the output beam or based on the monitored variations in the direction of the input beam.

22. The system of claim 17, further comprising a beam conditioning assembly configured to direct an initial beam to reflect from the measurement object and derive the input beam from the initial beam after it reflects from the measurement object.

23. The system of claim 22, wherein the beam conditioning assembly comprises an optical system configured to direct the initial beam to reflect from the measurement object to cause a change in propagating direction of the input beam in response to a change in the angular orientation of the measurement object with respect to the initial beam.

24. The system of claim 23, wherein the optical system comprises a single pass interferometer.

25. The system of claim 23, wherein the beam conditioning assembly further comprises an afocal system that scales the change in propagation direction of the conditioned beam by an amount related to a magnification of the afocal system.

26. The system of claim 25, wherein the factor is 2.

27. The system of claim 22, further comprising a beam splitter configured to derive a secondary beam from the initial beam and to direct the secondary beam to the angle interferometer, and wherein the angle interferometer is configured to monitor variations in the direction of the input beam by monitoring a direction of the secondary beam.

28. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the interferometry system of claim 17 for monitoring the position of the wafer relative to the imaged radiation.

29. A lithography system for use in fabricating integrated circuits on a wafer, the system comprising:
a stage for supporting the wafer; and
an illumination system including a radiation source, a mask, a positioning system, a lens assembly, and the interferometry system of claim 17,
wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

30. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the interferometry system of claim 17 for monitoring the position of the stage relative to the beam directing assembly.

31. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 1.

32. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 1; and
imaging the spatially patterned radiation onto a wafer.

33. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 1.

34. A method for fabricating integrated circuits, the method comprising the lithography method of claim 31.

35. A method for fabricating integrated circuits, the method comprising the lithography method of claim 32.

36. A method for fabricating integrated circuits, the method comprising the lithography method of claim 33.

37. A method for fabricating integrated circuits, the method comprising using the lithography system of claim 28.

38. A method for fabricating integrated circuits, the method comprising using the lithography system of claim 29.

39. A method for fabricating a lithography mask, the method comprising:
directing a write beam to a substrate to pattern the substrate;
positioning the substrate relative to the write beam; and
monitoring the position of the substrate relative to the write beam using the method of claim 1.

* * * * *